(12) United States Patent
Yoshimura

(10) Patent No.: US 8,614,490 B2
(45) Date of Patent: Dec. 24, 2013

(54) SEMICONDUCTOR DEVICE

(75) Inventor: Masaki Yoshimura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 175 days.

(21) Appl. No.: 13/224,855

(22) Filed: Sep. 2, 2011

(65) Prior Publication Data

US 2012/0056274 A1 Mar. 8, 2012

(30) Foreign Application Priority Data

Sep. 3, 2010 (JP) ................. 2010-197799

(51) Int. Cl.
*H01L 29/06* (2006.01)

(52) U.S. Cl.
USPC ...... 257/394; 257/401; 257/524; 257/E29.02; 257/E29.027

(58) Field of Classification Search
USPC .......... 257/206, 365, 401, E27.014, E27.029, 257/E29.027, E29.12, 394, 524, E29.02
See application file for complete search history.

(56) References Cited

U.S. PATENT DOCUMENTS

| 4,635,088 | A | * | 1/1987 | Eguchi ............. | 257/365 |
|---|---|---|---|---|---|
| 5,955,763 | A | * | 9/1999 | Lin ................. | 257/355 |
| 5,973,367 | A | * | 10/1999 | Williams ............ | 257/365 |
| 6,114,732 | A | * | 9/2000 | Sugimura et al. ..... | 257/365 |
| 6,198,128 | B1 | * | 3/2001 | Asakura et al. ...... | 257/337 |
| 6,268,632 | B1 | * | 7/2001 | Sugimura et al. ..... | 257/365 |
| 6,512,278 | B2 | * | 1/2003 | Asamura ............. | 257/401 |
| 6,552,402 | B1 | * | 4/2003 | Ozasa et al. ........ | 257/390 |
| 7,199,669 | B2 | * | 4/2007 | Jung et al. ......... | 330/311 |
| 7,242,242 | B2 | * | 7/2007 | Bedarida et al. ..... | 327/543 |
| 7,482,663 | B2 | * | 1/2009 | Knoblinger et al. ... | 257/401 |
| 7,598,541 | B2 | * | 10/2009 | Okamoto et al. ..... | 257/205 |
| 7,723,796 | B2 | * | 5/2010 | Tomita .............. | 257/368 |
| 7,851,833 | B2 | * | 12/2010 | Abe et al. .......... | 257/288 |
| 7,851,834 | B2 | * | 12/2010 | Yang et al. ......... | 257/288 |
| 8,053,346 | B2 | * | 11/2011 | Ryu et al. .......... | 438/587 |
| 8,350,339 | B2 | * | 1/2013 | Huang et al. ........ | 257/401 |
| 2004/0120175 | A1 | * | 6/2004 | Schrom et al. ....... | 365/51 |
| 2005/0073366 | A1 | * | 4/2005 | Jung et al. ......... | 330/311 |
| 2006/0170490 | A1 | * | 8/2006 | Bedarida et al. ..... | 327/543 |
| 2007/0181942 | A1 | * | 8/2007 | Knoblinger et al. ... | 257/336 |
| 2008/0067614 | A1 | * | 3/2008 | Choi et al. ......... | 257/401 |
| 2008/0073728 | A1 | * | 3/2008 | Fujii et al. ........ | 257/390 |
| 2010/0133589 | A1 | * | 6/2010 | Aruga et al. ........ | 257/206 |
| 2011/0298059 | A1 | * | 12/2011 | Huang et al. ........ | 257/401 |
| 2012/0056274 | A1 | * | 3/2012 | Yoshimura ........... | 257/394 |

FOREIGN PATENT DOCUMENTS

JP 2003-318278 11/2003
JP 2009-147881 7/2009

* cited by examiner

*Primary Examiner* — David Vu
*Assistant Examiner* — Earl Taylor

(57) ABSTRACT

A semiconductor device of the present invention includes: transistor Tr1 arranged on a semiconductor substrate; transistor Tr2 arranged such that a carrier drift direction thereof viewed on the semiconductor substrate is identical to a carrier drift direction of transistor Tr1; diffusion layer 51c connecting diffusion layers 51a and 51b on carrier supply sides of transistors Tr1 and Tr2; and contact plug 61 that is connected to a surface of diffusion layers 51a and 51b on the carrier supply sides of transistors Tr1 and Tr2 or that is connected to a surface of diffusion layer 51c connecting the diffusion layers to each other, and that supplies diffusion layers 51a and 51b with electricity.

11 Claims, 17 Drawing Sheets

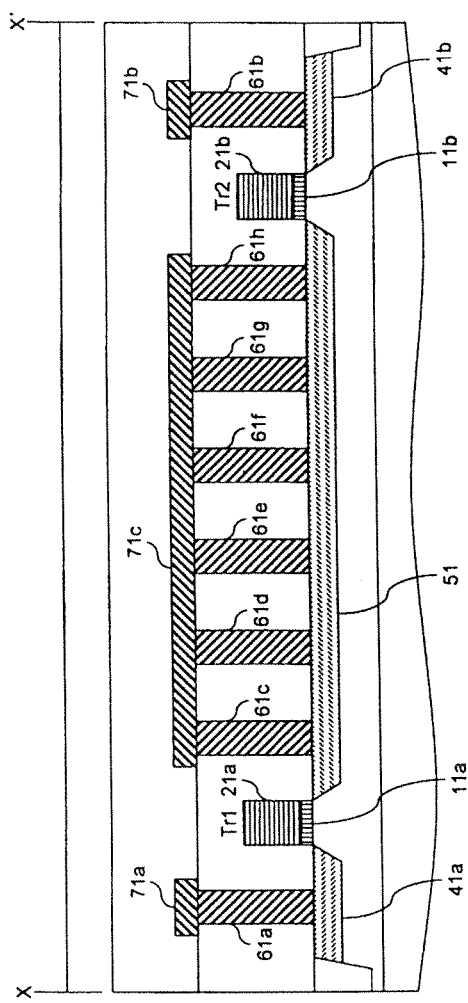

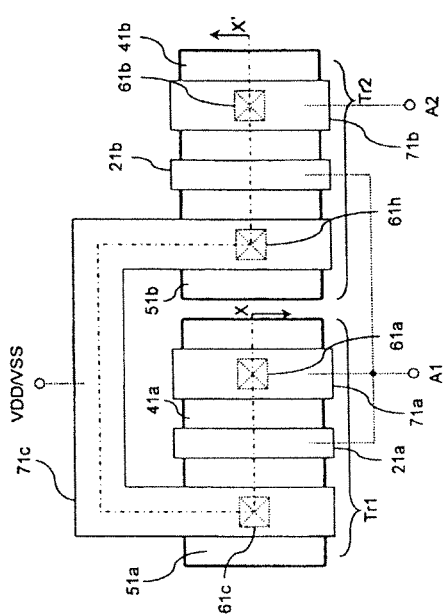
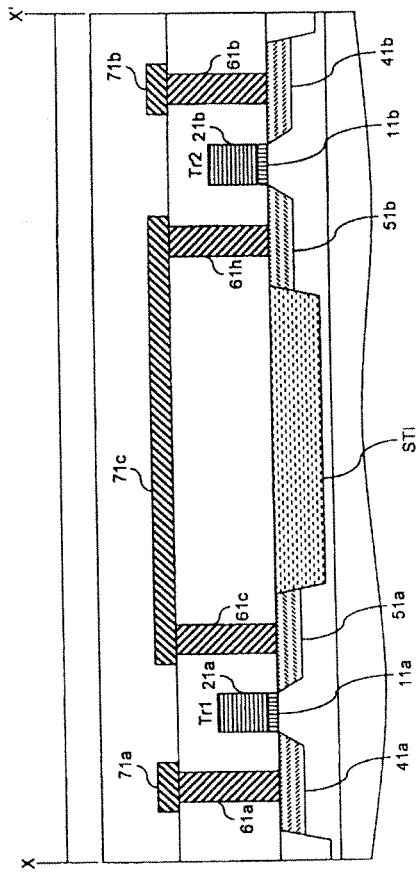
Fig.5A
Fig.5B

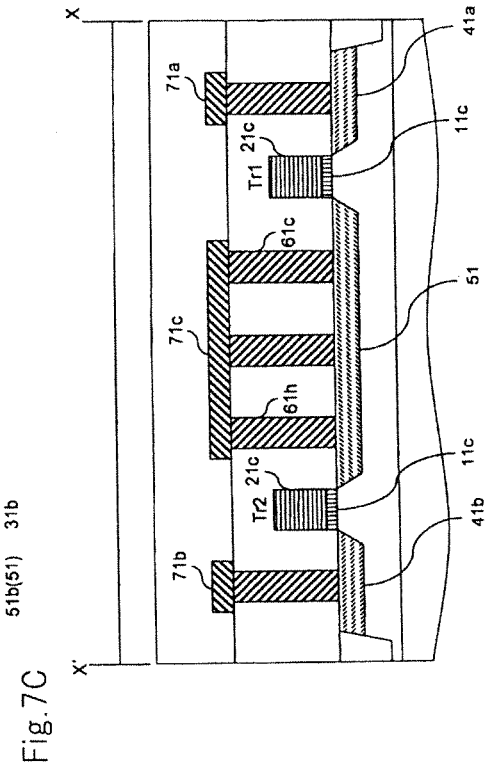
Fig.7B
Fig.7C
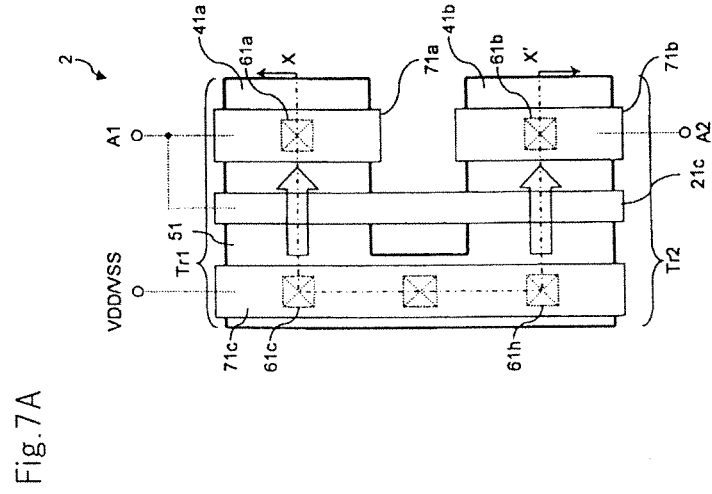
Fig.7A

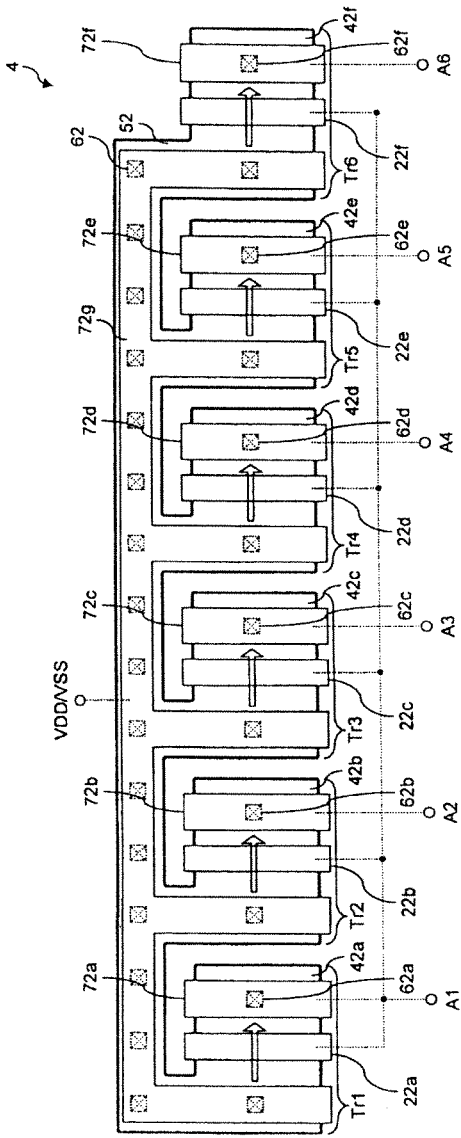
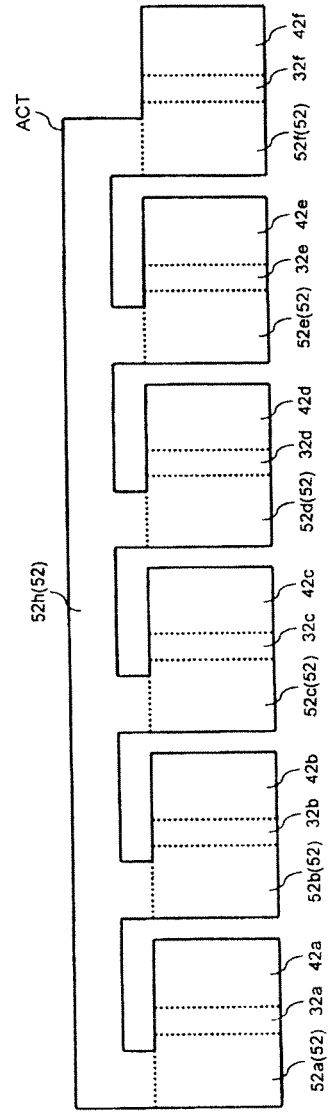
Fig. 10A
Fig. 10B

SEMICONDUCTOR DEVICE

This application is based upon and claims the benefit of priority from Japanese patent application No. 2010-197799, filed on Sep. 3, 2010, the disclosure of which is incorporated herein in its entirety by reference.

BACKGROUND OF THE INVENTION

1. Field of the Invention

The present invention relates to a semiconductor device including a pair of transistors.

2. Description of Related Art

A current mirror circuit and the differential input stage of an operational amplifier employ a pair of transistors, in which two transistors are arranged as a pair, in order to output an output current having a current value equivalent to or a certain times that of an input current.

In a case where MOS (metal oxide semiconductor) transistors configure the pair of transistors, the gates of both transistors are connected to each other and the sources are connected with a power source. In one of the transistors, the drain is connected with the gates of both the transistors. Hereinafter, the transistor whose drain is connected with the gates of both the transistors will be referred to as an input-side transistor, and the other transistor will be referred to as an output-side transistor.

Since the gates are connected to each other, when a drain current flows through the input-side transistor, the gate voltage of input-side transistor is applied to the gate of the output-side transistor and the drain current also flows through the output-side transistor and is output as the output current.

Here, even in a case of adopting a design so as to output an output current equivalent to or a certain times that of the input current, if the characteristics of the input-side and output-side transistors greatly vary, an error of the current value of the actually output current becomes large. Thus, characteristics of the transistors configuring the pair of transistors require a high ratio accuracy (relative accuracy).

JP2009-147881A discloses a current mirror circuit in which transistors connected in parallel to a power source via fuses are used as output-side transistors and trimming for adjusting the current value of an output current is performed by disconnecting the fuse.

JP2003-318278A discloses a mirror MOSFET including a mirror MOSFET structure in which two gate electrodes are formed in parallel in one active region, a source diffusion layer is formed in a region sandwiched by the two gate electrodes, and a drain diffusion layer is formed in a region opposite to the two gate electrodes with respect to the source diffusion layer. JP2003-318278A also discloses a current mirror circuit having a configuration in which two of the above mirror MOSFETs are arranged.

As described above, it is ideal that currents as designed flow through the transistors included in the pair of transistors. Achievement of this requires that characteristics of each transistor have a high ratio accuracy.

However, factors determining the characteristics of a transistor vary, depending upon the manufacturing process. Accordingly, the characteristics of the transistor also vary.

Here, since the drain current Id in a saturated region is represented by current $Id \propto \mu W/L \cdot (Vgs-Vth)^2$, the factors determining the characteristics of the transistor include, for instance, a carrier mobility ($\mu$), a channel length (L), a channel width (W) and a threshold voltage (Vth).

The factors determining the characteristics of the transistor also include a parasitic resistance.

According to the current mirror circuit disclosed in JP2009-147881A, the current value of the output current is adjusted by trimming, thereby reducing the error of the output current. According to the current mirror circuit disclosed in JP2003-318278A, the configuration in which two of the above mirror MOSFETs are arranged is adopted. This reduces variation in channel length, thereby reducing the error of the output current.

On the other hand, the inventor of the invention of this application has discovered that, as to the characteristics of the transistors in which high ratio accuracies are required, there is room to reduce the variations in characteristics owing to the parasitic resistance and the threshold voltage.

The variation in characteristics of the transistor owing to the parasitic resistance and the threshold voltage will hereinafter be described.

First, the variation in characteristics owing to the parasitic resistance will be described.

It is provided that, in a pair of transistors employed for a current mirror circuit or in the differential input stage of an operational amplifier, electrodes on a carrier supply side are set to a common potential. Hereinafter, it will be described such that the electrode on the carrier supply side is the source diffusion layer of the MOS transistor. Typically, in order to supply the diffusion layer with electricity, the diffusion layer and the wiring are connected to each other by a contact plug. In this case, there is contact resistance at the connection between the contact plug and the diffusion layer or the wiring. The contact resistance acts as parasitic resistance.

Variation in the contact resistances among transistors in which high ratio accuracies are required causes variation in characteristics of the transistors. Accordingly, the current value as designed cannot be achieved. Particularly, in a current mirror circuit, an output current with an output scaling factor as designed cannot be acquired.

Variation in the contact resistance further becomes obvious in a case where miniaturization of the semiconductor device increases the resistance of the contact plug itself.

Next, variation in characteristics owing to the threshold voltage will be described.

In some cases, in order to form a source/drain diffusion layer of the transistor, ion injection is applied to right and left regions of the gate electrode from an oblique direction with respect to the substrate. It is typically designed such that the source diffusion layer and the drain diffusion layer are symmetrical with each other. However, there is a case where the symmetry is reduced owing to oblique ion injection. In this case, a phenomenon may be caused in which the threshold voltage becomes different according to which one is employed as the source or the drain among the diffusion layers formed by the oblique ion injection. Variation in the threshold voltages among transistors in which high ratio accuracies are required causes the variation in characteristics of the transistors.

SUMMARY

The present invention seeks to solve one or more of the above problems, or to improve upon those problems at least in part.

In one embodiment, there is provided a semiconductor device that includes a first transistor that is arranged on a semiconductor substrate;

a second transistor that is arranged on the semiconductor substrate, and arranged such that a carrier drift direction thereof viewed on the semiconductor substrate is identical to a carrier drift direction of the first transistor;

a diffusion layer that is formed on the semiconductor substrate, and that connects diffusion layers on carrier supply sides of the first and second transistors to each other; and a contact plug that is connected to a surface of the diffusion layers on the carrier supply sides of the first and second transistors or that is connected to a surface of the diffusion layer connecting the diffusion layers to each other, and that supplies electricity to the diffusion layers on the carrier supply sides of the first and second transistors.

In another embodiment, there is provided a semiconductor device that includes a first transistor that includes a first diffusion layer, a first control electrode and a second diffusion layer sequentially formed in a first direction, said first diffusion layer being a main electrode on a carrier supply side;

a second transistor that includes a third diffusion layer, a second control electrode and a fourth diffusion layer sequentially formed in the first direction, said third diffusion layer being a main electrode on a carrier supply side;

a fifth diffusion layer that connects said first and third diffusion layers to each other;

a contact plug that is connected to at least one of the first, third and fifth diffusion layers, and supplies electricity to said first, third and fifth diffusion layers.

A semiconductor device according to one embodiment of the present invention includes a diffusion layer that connects the diffusion layers on the carrier supply sides of the first and second transistors to each other.

A semiconductor device according to another embodiment of the present invention includes a fifth diffusion layer that connects the first diffusion layer as the carrier supply side of the first transistor and the third diffusion layer as the carrier supply side of the second transistor to each other.

Accordingly, in both the semiconductor device according to one embodiment of the present invention and the semiconductor device according to another embodiment of the present invention, the diffusion layers on the carrier supply sides of the first and second transistors are connected to each other.

Even in a case where there is a variation in the contact resistances of contact plugs connecting the diffusion layers, the connection between the diffusion layers on the carrier supply sides of the first and second transistors allows this variation to uniformly exert an influence on characteristics of the first and second transistors. This enables variation in characteristics to be reduced.

Further, the semiconductor device according to one embodiment of the present invention includes the first and second transistors arranged such that carrier drift directions become the same.

Moreover, the semiconductor device according to another embodiment of the present invention includes: a first transistor including the first diffusion layer as the carrier supply side, the first control electrode and the second diffusion layer that are formed in the first direction; and the second transistor including the third diffusion layer as the carrier supply side, the second control electrode and the fourth diffusion layer that are formed in the first direction. Here, carrier drift occurs in a direction from the diffusion layer on the carrier supply side toward the other diffusion layer. Accordingly, both the carrier drift directions of the first and second transistors of the semiconductor device according to another embodiment of the present invention are the first direction. That is, the semiconductor device according to another embodiment of the present invention includes the first and second transistors arranged such that the carrier drift directions thereof are the same.

Accordingly, both the semiconductor device according to one embodiment of the present invention and the semiconductor device according to another embodiment of the invention include the first and second transistors arranged such that the carrier drift directions thereof are the same.

The first and second transistors are thus arranged such that the carrier drift directions are the same. Accordingly, threshold voltages of the first and second transistors barely vary, thereby allowing the variation in characteristics to be reduced.

BRIEF DESCRIPTION OF THE DRAWINGS

The above features and advantages of the present invention will be more apparent from the following description of certain preferred embodiments taken in conjunction with the accompanying drawings, in which:

FIG. 4 is a sectional view taken along line X-X' shown in FIG. 2;

FIG. 5A is a plan view showing a configuration of a related semiconductor device;

FIG. 5B is a sectional view taken along line X-X' shown in FIG. 5A;

FIG. 7A is a plan view of another configuration of a semiconductor device of the first exemplary embodiment;

FIG. 7B is a plan view of a substrate surface of the semiconductor device shown in FIG. 7A;

FIG. 7C is a sectional view taken along line X-X' shown in FIG. 7A;

FIG. 10A is a plan view showing another configuration of a semiconductor device of the second exemplary embodiment;

FIG. 10B is a plan view of a substrate surface of the semiconductor device shown in FIG. 10A;

DETAILED DESCRIPTION OF THE PREFERRED EMBODIMENTS

The invention will be now described herein with reference to illustrative embodiments. Those skilled art will recognize that many alternative embodiments can be accomplished using the teaching of the present invention and that the invention is not limited to the embodiments illustrated for explanatory purposes.

First Exemplary Embodiment

Figure 1A:
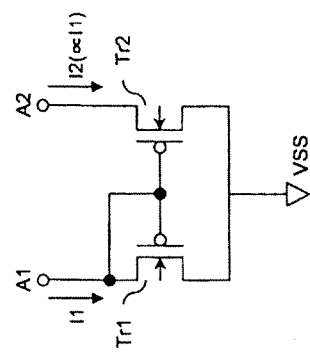
FIG. 1A is a circuit diagram of a single output current mirror circuit including P-type MOS transistors.
Figure 1B:
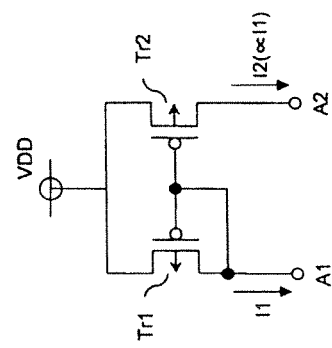
FIG. 1B is a circuit diagram of a single output current mirror circuit including N-type MOS transistors.

FIGS. 1A and 1B are circuit diagrams of a single output current mirror circuit. FIG. 1A shows a circuit diagram in a case where transistors configuring the current mirror circuit are P-type MOS transistors. FIG. 1B shows a circuit diagram in a case where transistors configuring the current mirror circuit are N-type MOS transistors.

As shown in FIGS. 1A and 1B, a single output current mirror circuit includes a pair of transistors in which transistors Tr1 and Tr2 are paired with each other.

In a case where transistors Tr1 and Tr2 are P-type MOS transistors, the gates of transistors Tr1 and Tr2 come to be at the same potential when the gates of transistors Tr1 and Tr2 are connected to each other as shown in FIG. 1A. In transistors Tr1 and Tr2, the source is connected with power source potential VDD. In transistor Tr1, the drain is connected with the gates of transistors Tr1 and Tr2 and terminal A1. In transistor Tr2, the drain is connected with terminal A2.

On the other hand, in a case where transistors Tr1 and Tr2 are N-type MOS transistors, as shown in FIG. 1B, in transistors Tr1 and Tr2, the source is connected with ground potential VSS. Since the other connection relationships are identical to those shown in FIG. 1A, description thereof is omitted.

Next, an operation of the current mirror circuits shown in FIGS. 1A and 1B will be described.

When drain current I1 flows through transistor Tr1, since the gates of transistors Tr1 and Tr2 are connected to each other, the gate voltage of transistor Tr1 is also applied to the gate of transistor Tr2. The application of the gate voltage causes drain current I2 to flow through transistor Tr2.

As described above, drain current Id of the transistor is represented by $Id \propto \mu W/L \cdot (Vgs-Vth)^2$. In the current mirror circuits shown in FIGS. 1A and 1B, the gate voltages of transistors Tr1 and Tr2 are identical to each other. Provided that, for instance, carrier mobilities ($\mu$) and threshold voltages (Vth) of transistors Tr1 and Tr2 are identical to each other, currents I1 and I2 depend only on the channel dimensions of the respective transistors.

Accordingly, in a case where, for instance, the channel widths and the channel lengths of transistors Tr1 and Tr2 are identical to each other, the current value of current I2 is identical to that of current I1. In a case where the channel length of transistor Tr2 is half that of transistor Tr1, the current value of current I2 is twice as much as that of current I1. In a case where the channel width of transistor Tr2 is half that of transistor Tr1, the current value of current I2 is half that of current I1.

Here, even in a case where it is designed such that the current value of current I2 is equivalent to or a certain times that of current I1, if the characteristics of transistors Tr1 and Tr2 greatly vary, current I2 as designed cannot be acquired. Accordingly, high ratio accuracies are required for the characteristics of transistors Tr1 and Tr2 configuring the pair of transistors.

Next, a configuration of semiconductor device 1 of this exemplary embodiment will be described.

Figure 2:
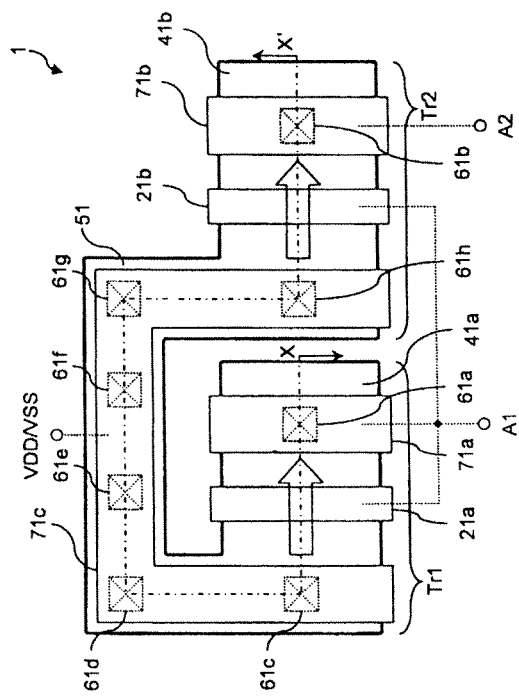
FIG. 2 is a plan view showing a configuration of a semiconductor device of a first exemplary embodiment.
Figure 3:
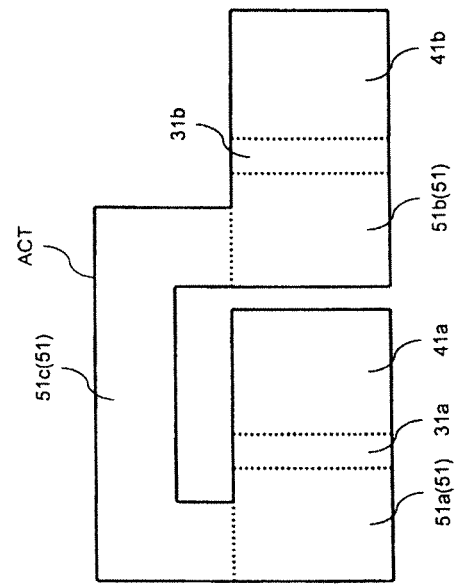
FIG. 3 is a plan view of a substrate surface of the semiconductor device shown in FIG. 2.

FIG. 2 is a plan view of semiconductor device 1 of this exemplary embodiment. FIG. 3 is a plan view of a substrate surface of semiconductor device 1. FIG. 4 is a sectional view taken along line X-X' of FIG. 2 viewed in the direction of the arrow.

Referring to FIGS. 2 and 4, semiconductor device 1 includes two transistors Tr1 and Tr2.

More specifically, gate insulating films 11a and 11b are formed on a semiconductor substrate. Gate electrodes 21a and 21b are formed on gate substrate films 11a and 11b, respectively. Diffusion layers are formed in right and left regions of each of gate electrodes 21a and 21b.

The details of the diffusion layer formed on the semiconductor substrate surface will be described with reference to FIG. 3. In FIG. 3, regions enclosed by solid lines indicate active regions ACT in which source diffusion layers and drain diffusion layers are formed. Active regions ACT are enclosed by element separation regions.

Referring to FIG. 3, channel region 31a is a region among active regions ACT immediately below gate electrode 21a shown in FIG. 2. Diffusion layers 41a and 51a are formed so as to be adjacent to the right and left of channel region 31a among active regions ACT. Channel region 31b is a region among active regions ACT immediate below gate electrode 21b shown in FIG. 2. Diffusion layers 41b and 51b are formed so as to be adjacent to the right and left of channel region 31b among active regions ACT. Adjacent diffusion layers 41a and 51b are separated by the element separation region.

Further, in semiconductor device 1, diffusion layer 51c is formed that protrudes from a part of diffusion layer 51a and extends to diffusion layer 51b so as to be separated from diffusion layers 41a and 41b by the element separation region. The formation of diffusion layer 51c attains a state in which diffusion layers 51a to 51c are continuously formed, and diffusion layer 51c connects diffusion layers 51a and 51b to each other. The shape of diffusion layer 51c is not limited to that shown in FIG. 3. Any shape may be adopted provided that diffusion layer 51c is not connected to diffusion layers 41a and 41b and diffusion layer 51c extends from diffusion layer 51a to diffusion layer 51b.

Here, diffusion layers 51a and 51b, diffusion layer 51c that connects diffusion layers 51a and 51b to each other, and diffusion layers 41a and 41b are of the same conductive type, which is the reverse of the conductive type of channel regions 31a and 31b.

In FIG. 3, for the sake of convenience of description, diffusion layers 51a to 51c have separately been described. However, these diffusion layers are continuously formed and integrated. Hereinafter, the diffusion layers including diffusion layers 51a to 51c will collectively be referred to as diffusion layer 51.

Referring again to FIGS. 2 and 4, diffusion layer 41a is connected to wiring 71a via contact plug 61a connected to the surface of diffusion layer 41a. Diffusion layer 41b is connected to wiring 71b via contact plug 61b. Diffusion layer 51 is connected to wiring 71c via contact plugs 61c to 61h.

Wiring 71a is connected to terminal A1. Gate electrodes 21a and 21b are connected to terminal A1 and come to be at the same potential.

Wiring 71b is connected to terminal A2.

Wiring 71c is connected to power source potential VDD or ground potential VSS. Diffusion layer 51 connected to wiring 71c becomes a diffusion layer on a carrier supply side, that is, a source diffusion layer, by connecting wiring 71c to power source potential VDD or ground potential VSS. Diffusion layer 51 (51a to 51c) will hereinafter be referred to as source diffusion layer 51 (51a to 51c). Diffusion layer 41a connected to wiring 71a and diffusion layer 41b connected to wiring 71b will hereinafter be referred to as drain diffusion layers 41a and 41b, respectively.

As described with reference to FIGS. 2 to 4, semiconductor device 1 includes: transistor Tr1 including source diffusion layer 51a, gate electrode 21a and drain diffusion layer 41a; and transistor Tr2 including source diffusion layer 51b, gate electrode 21b and drain diffusion layer 41b.

In transistors Tr1 and Tr2, the gates are connected to each other, the sources are connected with power source potential VDD or ground potential VSS. The drain of transistor Tr1 is connected with the gates of transistors Tr1 and Tr2 and terminal A1. The drain of transistor Tr2 is connected with terminal A2. The connection relationship between transistors Tr1 and Tr2 is identical to that of the pair of transistors in the current mirror circuits shown in FIGS. 1A and 1B. Accordingly, semiconductor device 1 corresponds to the current mirror circuits shown in FIGS. 1A and 1B.

The configuration of semiconductor device 1 of this exemplary embodiment has been described above with reference to FIGS. 2 to 4. The characteristic points of this configuration will hereinafter be described in further detail.

Semiconductor device 1 has the following two characteristic points in the configuration.

A first characteristic point is that source diffusion layers 51a and 51b as the diffusion layers on the carrier supply side of transistors Tr1 and Tr2 are connected to each other by forming source diffusion layer 51c. A second characteristic point is that transistors Tr1 and Tr2 are arranged in a direction in which the carrier drift directions become the same.

The characteristic points will hereinafter be described in detail.

First, the first characteristic point will be described.

For the sake of comparison with semiconductor device 1, FIG. 5A shows a plan view of a related semiconductor device; FIG. 5B shows a sectional view taken along line X-X' shown in FIG. 5A viewed in the arrow direction. In FIGS. 5A and 5B, configurational elements corresponding to those shown in FIGS. 2 to 4 are assigned with identical symbols. Description thereof is omitted.

The semiconductor device shown in FIGS. 5A and 5B is different from semiconductor device 1 in that source diffusion layer 51a of transistor Tr1 and source diffusion layer 51b of transistor Tr2 are separated from each other by element separation region STI and connected to each other only by wiring 71c.

As described above, the source diffusion layers of the transistors configuring the pair of transistors come to be at the common potential. In order to let the source diffusion layer of each transistor be at the same common potential, as with for instance the semiconductor devices shown in FIGS. 5A and 5B, it is sufficient that source diffusion layer 51a of transistor Tr1 be connected to wiring 71c via contact plug 61c, and source diffusion layer 51b of transistor Tr2 be connected to wiring 71c via contact plug 61h.

On the other hand, in semiconductor device 1, source diffusion layer 51c extending from source diffusion layer 51a of transistor Tr1 to source diffusion layer 51b of transistor Tr2 is formed. The formation of source diffusion layer 51c attains a state in which source diffusion layers 51a to 51c are continuously formed, and source diffusion layer 51c connects source diffusion layers 51a and 51b to each other. That is, transistors Tr1 and Tr2 share source diffusion layer 51 including source diffusion layers 51a to 51c.

The state in which diffusion layers 51a to 51c are continuously formed is a state in which the conductive types of the diffusion layers are identical to each other. In order to reduce variation in resistance in the diffusion layer, diffusion layers 51a to 51c are preferably formed such that the carrier concentration, the depth, and the width viewed in the carrier drift direction are uniform.

Here, the diffusion layer is formed by applying an ion injection process or heat treatment to a semiconductor substrate. Accordingly, when diffusion layers 51a to 51c are formed, formation of the diffusion layers in the same step allows the layers to be of the same conductive type, and further allows the carrier concentration and the depth to be uniform. The formation in the same step is a formation of the diffusion layers by applying, for instance, the same ion injection process or the same heat treatment.

The source diffusion layers are shared between transistors Tr1 and Tr2 by connecting source diffusion layers 51a and 51b to each other, thereby variation in contact resistance is shared between the transistors. As a result, this enables the variation in characteristics of the transistors to be reduced.

Hereinafter, provided that contact resistances, that occur at the point where plugs 61c and 61h, shown in FIGS. 4, and 5B connect with the source diffusion layer, are different, adverse effects of the variation of the contact resistance on the characteristics of transistors Tr1 and Tr2 will be described.

As with the semiconductor device shown in FIGS. 5A and 5B, in a case of connecting source diffusion layer 51a of transistor Tr1 and source diffusion layer 51b of transistor Tr2 to each other only by wiring 71c, the contact resistance between contact plug 61c and source diffusion layer 51a only affects the current value of the current flowing through transistor Tr1. The contact resistance between contact plug 61h and source diffusion layer 51b only affects the current value of the current flowing through transistor Tr2. Accordingly, the characteristics of each transistor independently vary, and thus the current ratio designed as the current mirror circuit cannot be realized.

On the other hand, as with semiconductor device 1, in a case where source diffusion layer 51a of transistor Tr1 and source diffusion layer 51b of transistor Tr2 are connected to each other by forming source diffusion layer 51c, even if there is a variation in contact resistances of the connections between contact plugs 61c and 61h and source diffusion layer 51, the contact resistances similarly affect the current values of both the currents flowing through transistors Tr1 and Tr2.

In other words, since contact plugs 61c and 61h are connected to the same source diffusion layer 51, the contact resistances between each contact plug and source diffusion layer 51 uniformly affects transistors Tr1 and Tr2 sharing source diffusion layer 51. Accordingly, even if the contact resistances at the connections between contact plugs 61c and 61h and source diffusion layer 51 vary, the variation does not exert different influences on the characteristics of the transistors. Therefore, this can reduce the variation in characteristics of the transistors in which high ratio accuracies are required.

In FIGS. 2 to 4, source diffusion layer 51 shared by transistors Tr1 and Tr2 are connected with the contact plugs. However, the number of the contact plugs for supplying source diffusion layer 51 with electricity may be one. Adoption of a single contact plug to be connected can eliminate the variation in characteristics of the transistors owing to the variation in contact resistance.

Next, the second characteristic point will be described.

Figure 6A:
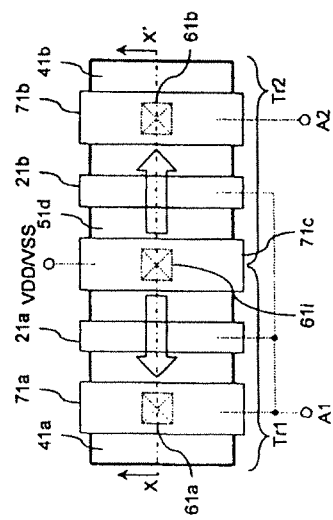
FIG. 6A is a plan view showing another configuration of a related semiconductor device.
Figure 6B:
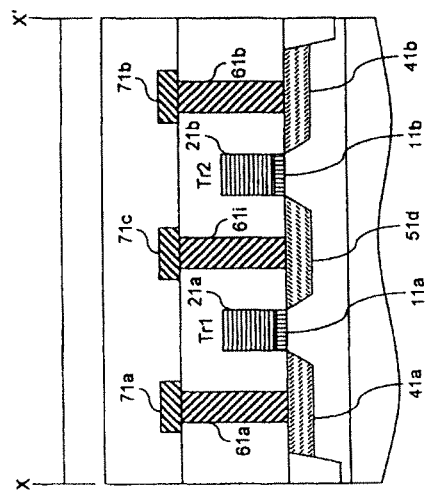
FIG. 6B is a sectional view taken along line X-X' shown in FIG. 6A.

For the sake of comparison with semiconductor device 1, FIG. 6A shows a plan view of a related semiconductor device. FIG. 6B shows a sectional view taken along line X-X' shown in FIG. 6A viewed in the arrow direction. In FIGS. 6A and 6B, configurational elements corresponding to those shown in FIGS. 2 to 4 are assigned with identical symbols. Description thereof is omitted.

The semiconductor device shown in FIGS. 6A and 6B is different from semiconductor device 1 in that the arrangement relationship between source diffusion layer 51b and drain diffusion layer 41b of transistor Tr2 is reversed. More specifically, in the semiconductor device shown in FIGS. 6A and 6B, diffusion layer 51d formed in a region sandwiched by gate electrodes 21a and 21b is connected to wiring 71c, which is connected to power source potential VDD or ground potential VSS, via contact plug 61i, thereby realizing the source diffusion layer. Diffusion layer 51d will hereinafter be referred to as source diffusion layer 51d.

In order to share source diffusion layer between transistors Tr1 and Tr2 as the first characteristic point of semiconductor device 1, as with semiconductor device shown in FIGS. 6A and 6B, it is sufficient that source diffusion layer 51d formed in the region sandwiched by gate electrodes 21a and 21b of transistors Tr1 and Tr2 be shared. In this case, as indicated by hollow arrows in FIG. 6A, the carrier drift directions (the directions from the source diffusion layers to the drain diffusion layers) of transistors Tr1 and Tr2 are reversed.

On the other hand, in semiconductor device 1, while the direction in which source diffusion layer 51a, gate electrode 21a and drain diffusion layer 41a of transistor Tr1 are formed in this sequence and the direction in which source diffusion layer 51b, gate electrode 21b and drain diffusion layer 41b of transistor Tr2 are formed in this sequence are the same, source diffusion layers 51a and 51b are connected to each other by forming source diffusion layer 51c.

Accordingly, as indicated by hollow arrows in FIG. 2, the carrier drift directions of transistors Tr1 and Tr2 viewed on the semiconductor substrate become the same.

Here, in a step of forming a LDD (lightly doped drain) structure in which a low concentration region of impurity is provided in the source/drain diffusion layer or between the source/drain diffusion layer and the channel region, in order to normally inject the impurity into a lower part on a side of the gate electrode, the ion injection may be applied from an oblique direction with respect to the substrate. The source/drain diffusion layers are typically designed symmetrical. However, it is difficult to completely match the incident angle of the oblique ion injection applied into a lower part of the right side of the gate electrode with that applied into a lower part of the left side. Accordingly, there is concern that the impurities in and around the channel region are different between the lower parts of the right and left sides of the gate electrode, and the symmetry of the source/drain diffusion layer is reduced.

If the symmetry of the source/drain diffusion layer is low, a phenomenon may be caused in which the threshold voltage varies according to which the right or left diffusion layer is adopted as the source or the drain diffusion layer. In other words, a phenomenon may be caused in which the threshold voltage varies according to which direction the carriers drifted in the transistor arranged on the substrate.

Here, in the semiconductor device shown in FIGS. 6A and 6B, the arrangement relationship between source/drain diffusion layers of transistors Tr1 and Tr2 is reversed (the carrier drift direction is reversed). Accordingly, the threshold voltages of the respective transistors may be different from each other.

On the other hand, in semiconductor device 1, the arrangement relationship between the source/drain diffusion layers of transistors Tr1 and Tr2 is the same (the carrier drift directions are the same). Accordingly, the variation in symmetry of the source/drain diffusion layer of each transistor is reduced. There is hardly any difference in threshold. The variation in characteristics of the transistors can be reduced.

As described above, semiconductor device 1 of this exemplary embodiment includes the aforementioned first and second characteristic points in terms of the configuration.

That is, semiconductor device 1 includes: transistor Tr1 as a first transistor; transistor Tr2, as a second transistor, arranged in the direction in which the carrier drift direction viewed on the semiconductor substrate becomes the same as the direction of transistor Tr1; and source diffusion layer 51c connecting source diffusion layers 51a and 51b to each other as the diffusion layers on the carrier supply side of transistors Tr1 and Tr2.

In other words, semiconductor device 1 includes: transistor Tr1, as the first transistor, including source diffusion layer 51a as a first diffusion layer, gate electrode 21a as a first control electrode and drain diffusion layer 41a as a second diffusion layer; transistor Tr2 as a second transistor including source diffusion layer 51b as a third diffusion layer, gate electrode 21b as a second control electrode, and drain diffusion layer 41b as a fourth diffusion layer; and source diffusion layer 51c as a fifth diffusion layer connecting source diffusion layers 51a and 51b to each other. The source diffusion layer, the gate electrode, the drain diffusion layer of each of transistors Tr1 and Tr2 are sequentially formed in the same direction (first direction).

Source diffusion layer 51a of transistor Tr1 and source diffusion layer 51b of transistor Tr2 are connected to each other by forming source diffusion layer 51c, thereby causing the transistors to share the source diffusion layer. Accordingly, even if there is a variation in contact resistances of contact plugs connected to the source diffusion layer, the variation uniformly affects the characteristics of the transistors sharing the source diffusion layer. This allows the variation in characteristics of the transistors to be reduced.

Transistors Tr1 and Tr2 are arranged in the direction in which the carrier drift directions become the same. Accordingly, variation in the threshold voltages of the transistors hardly occurs, and variation in characteristics of the transistors can be reduced.

In this exemplary embodiment, description has been made using the example of semiconductor device 1 in which transistors Tr1 and Tr2 are arranged laterally adjacent to each other with respect to the direction in which the gate electrode extends. However, the configuration is not limited thereto. The transistors may be vertically adjacent to each other with respect to the direction in which the gate electrode extends. FIGS. 7A to 7C show such a configuration of semiconductor device 2. FIG. 7A is a plan view of semiconductor device 2. FIG. 7B is a plan view of a substrate surface of semiconductor device 2. FIG. 7C is a sectional view taken along line X-X' shown in FIG. 7A viewed in the arrow direction. In FIGS. 7A to 7C, configurational elements corresponding to those in FIGS. 2 to 4 are assigned with the identical symbols. Description thereof is omitted.

Semiconductor device 2 shown in FIGS. 7A to 7C includes transistors Tr1 and Tr2 that share gate electrode 21c and are vertically adjacent to each other with respect to the direction in which gate electrode 21c extends. Diffusion layers are formed in the right and left regions of the region in which gate electrode 21c is formed.

The details of diffusion layer formed on the semiconductor substrate surface of semiconductor device 2 will be described with reference to FIG. 7B.

Referring to FIG. 7B, channel regions 31a and 31b are regions among active regions ACT immediately below gate electrode 21c shown in FIG. 7A. Diffusion layers 41a and 51a are formed so as to be laterally adjacent to channel region 31a among active regions ACT. Diffusion layers 41b and 51b are formed so as to be laterally adjacent to channel region 31b.

Further, in semiconductor device 2, diffusion layer 51e that protrudes from a part of diffusion layer 51a and extends to diffusion layer 51b is formed. The formation of diffusion layer 51e attains a state in which diffusion layer 51a and source diffusion layers 51b and 51e are continuously formed, and diffusion layer 51e connects diffusion layer 51a and source diffusion layer 51b to each other. The shape of diffusion layer 51e is not limited to that shown in FIG. 7B. Any shape may be adopted provided that diffusion layer 51e is not connected to diffusion layers 41a and 41b and diffusion layer 51e extends from diffusion layer 51a to diffusion layer 51b.

Here, diffusion layers 51a and 51b, diffusion layer 51e that connects these diffusion layers, and diffusion layers 41a and 41b are of the same conductive type, which is the reverse of the conductive type of channel regions 31a and 31b.

In FIG. 7B, for the sake of convenience of description, diffusion layers 51a, 51b and 51e have been described separately. However, these diffusion layers are continuously formed and integrated. Hereinafter, the diffusion layer including diffusion layers 51a, 51b and 51e will be collectively referred to as diffusion layer 51.

Referring again to FIG. 7A, diffusion layer 51 is connected to wiring 71c via contact plugs 61.

Wiring 71c is connected to power source potential VDD or ground potential VSS. Diffusion layer 51 connected to wiring 71c becomes a source diffusion layer by connecting wiring 71c to power source potential VDD or ground potential VSS. Diffusion layer 51 (51e) will hereinafter be referred to as source diffusion layer 51 (51e).

As described above with reference to FIGS. 7A and 7B, semiconductor device 2 includes: transistor Tr1 including source diffusion layer 51a, gate electrode 21c and drain diffusion layer 41a; and transistor Tr2 including source diffusion layer 51b, gate electrode 21c, and drain diffusion layer 41b.

Transistors Tr1 and Tr2 share gate electrode 21c, and the gates come to be at the same potential. The sources of transistors Tr1 and Tr2 are connected with power source potential VDD or ground potential VSS. The drain of transistor Tr1 is connected with the gates of transistors Tr1 and Tr2 and terminal A1. The drain of transistor Tr2 is connected with terminal A2. This connection relationship between transistors Tr1 and Tr2 is identical to that of the pair of transistors in the current mirror circuit shown in FIG. 1. Accordingly, semiconductor device 2 corresponds to the current mirror circuit shown in FIG. 1.

Here, in semiconductor device 2, as shown in FIG. 7B, source diffusion layers 51a and 51b are connected to each other by forming source diffusion layer 51e. In semiconductor device 2, transistors Tr1 and Tr2 share source diffusion layer 51 including source diffusion layers 51a, 51b and 51e.

In semiconductor device 2, transistors Tr1 and Tr2 are arranged in a direction in which the carrier drift directions indicated by hollow arrows shown in FIG. 7A come to be in the same direction.

That is, semiconductor device 2 has characteristics identical to the first and second characteristic points of semiconductor device 1 discussed above.

As described above, semiconductor device 1 has the first and second characteristic points, thereby allowing variation in characteristics of transistors Tr1 and Tr2 to be reduced. Accordingly, semiconductor device 2 also allows variation in characteristics of the transistors to be reduced as with semiconductor device 1.

Second Exemplary Embodiment

Figure 8A:
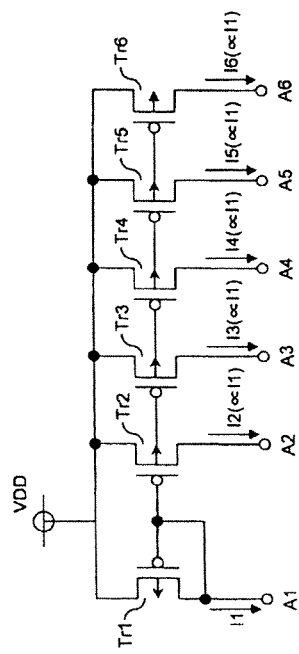
FIG. 8A is a circuit diagram of a five-output current mirror circuit including P-type MOS transistors.
Figure 8B:
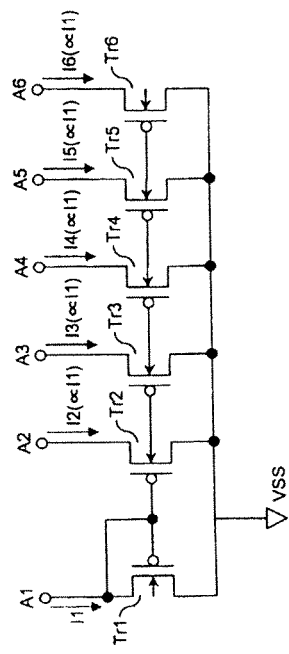
FIG. 8B is a circuit diagram of a five-output current mirror circuit including N-type MOS transistors.

FIGS. 8A and 8B are circuit diagrams of a five-output current mirror circuit. FIG. 8A shows the circuit diagram in a case where transistors configuring the current mirror circuit are P-type MOS transistors. FIG. 8B is the circuit diagram in a case of N-type MOS transistors.

Hereinafter, description will be made using a case shown in FIG. 8A where the transistors configuring the current mirror circuit are P-type MOS transistors.

The current mirror circuit shown in FIG. 8A includes a transistor group including six transistors Tr1 to Tr6.

The sources of transistors Tr1 to Tr6 are connected with power source potential VDD.

The gate of transistor Tr1 is connected with the gate of transistor Tr2, and the drain being connected with the gates of transistors Tr1 to Tr6 and terminal A1.

The gate of transistor Tr2 is connected with the gates of transistors T0 and Tr3, the drain being connected with terminal A2.

The gate of transistor Tr3 is connected with the gates of transistors Tr2 and Tr4, the drain being connected with terminal A3.

The gate of transistor Tr4 is connected with the gates of transistors Tr3 and Tr5, and the drain being connected with terminal A4.

The gate of transistor Tr5 is connected with the gates of transistors Tr4 and Tr6, and the drain being connected with terminal A5.

The gate of transistor Tr6 is connected with the gate of transistor Tr5, the drain being connected with terminal A6.

In a case where the transistors configuring the current mirror circuit are N-type MOS transistors, the sources of transistors Tr1 to Tr6 are connected with ground potential VSS as shown in FIG. 8B. The other connection relationship is identical to that shown in FIG. 8A. Accordingly, description thereof is omitted.

Next, operations of the current mirror circuits shown in FIGS. 8A and 8B will be described.

When drain current I1 flows through transistor Tr1, since the gates of transistors Tr1 to Tr6 are connected to each other, the gates come to be at the same potential, and the gate voltage of transistor Tr1 is also applied to the gates of transistors Tr2 to Tr6. The application of the gate voltage causes drain currents I2 to I6 to flow through transistors Tr2 to Tr6, respectively.

As described above, drain current Id of the transistor is represented by Id∝μW/L·(Vgs−Vth)². The gate voltages of transistors Tr1 to Tr6 are the same. Thus, for instance, provided that carrier mobilities (μ) and threshold voltages (Vth) are the same among transistors Tr1 to Tr6, currents I1 to I6 depend only on the respective channel dimensions of transistors Tr1 to Tr6.

Accordingly, in a case where, for instance, the channel widths and the channel lengths of transistors Tr1 to Tr6 are identical to each other, the current values of currents I2 to I6 become identical to the current value of current I1. In a case where the channel lengths of transistors Tr2 to Tr6 are half the channel length of transistor Tr1, the current values of currents I2 to I6 are twice as much as the current value of current I1. In a case where the channel widths of transistors Tr2 to Tr6 are half the channel width of transistor Tr1, the current values of currents I2 to I6 are half the current value of current I1.

Here, even in a case where it is designed such that the current values of currents I2 to I6 are equivalent to or a certain times that of the current value of current I1, if the characteristics of the transistors Tr1 to Tr6 greatly vary, currents I2 to I6 as designed cannot be acquired. Accordingly, high ratio accuracies are required for characteristics of transistors Tr1 to Tr6 configuring the transistor group.

Figure 9A:
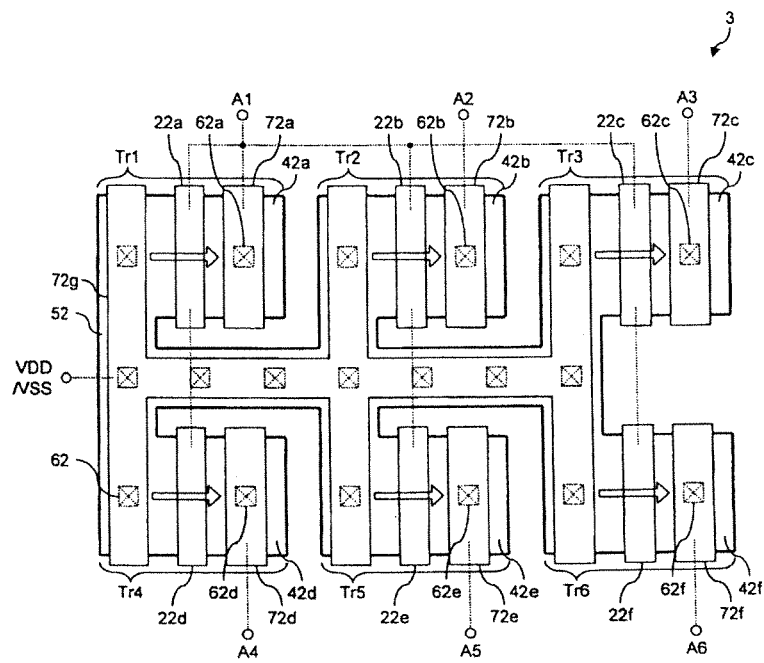
FIG. 9A is a plan view showing a configuration of a semiconductor device of a second exemplary embodiment.
Figure 9B:
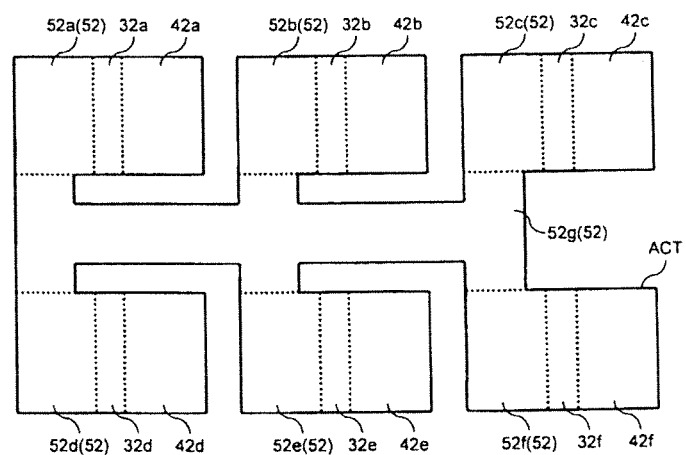
FIG. 9B is a plan view of a substrate surface of the semiconductor device shown in FIG. 9A.

Next, a configuration of semiconductor device 3 of the second exemplary embodiment will be described with reference to FIGS. 9A and 9B. FIG. 9A is a plan view of semiconductor device 3. FIG. 9B is a plan view of a substrate surface of semiconductor device 3.

As shown in FIG. 9A, semiconductor device 3 includes transistors Tr1 to Tr6.

More specifically, gate electrodes 22a to 22f of transistors Tr1 to Tr6 are formed along intersecting columns and rows. Gate electrodes 22a to 22c are formed on a first row. Gate electrodes 22d to 22f are formed on a second row. Gate electrodes 22a and 22d are connected to each other. Gate electrode 22b and gate electrode 22e are connected to each other. Gate electrodes 22c and 22f are connected to each other. Diffusion layers are formed in the right and left regions of gate electrodes 22a to 22f.

The details of the diffusion layers formed on the semiconductor substrate surface will be described with reference to FIG. 9B. In FIG. 9B, regions enclosed by solid lines indicate active regions ACT. Active regions ACT are enclosed by element separation regions.

Referring to FIG. 9B, channel regions 32a to 32f are regions among active regions ACT immediately below respective gate electrodes 22a to 22f shown in FIG. 9A. Diffusion layers 42a and 52a are formed so as to be laterally adjacent to channel region 32a in active regions ACT. Diffusion layers 42b and 52b are formed so as to be laterally adjacent to channel region 32b in active regions ACT. Diffusion layers 42c and 52c are formed so as to be laterally adjacent to channel region 32c in active regions ACT. Diffusion layers 42d and 52d are formed so as to be laterally adjacent to channel region 32d in active regions ACT. Diffusion layers 42e and 52e are formed so as to be laterally adjacent to channel region 32e in active regions ACT. Diffusion layers 42f and 52f are formed so as to be laterally adjacent to channel region 32f in active regions ACT.

In semiconductor device 3, diffusion layer 52g is formed so as to protrude from a part of diffusion layer 52a, be separated from diffusion layers 42a to 42f by the element separation regions, and extends to diffusion layers 52b to 52f. The formation of diffusion layer 52g attains a state in which diffusion layers 52a to 52g are continuously formed, and in which diffusion layers 52a to 52f are connected to each other. Diffusion layer 52g is not limited to the shape shown in FIG. 9B. Any shape may be adopted provided that diffusion layer 52g is not connected to diffusion layers 42a to 42f and diffusion layer 52g extends from diffusion layer 52a to diffusion layers 52b to 52f.

Here, diffusion layers 52a to 52f, diffusion layer 52g that connects these diffusion layers, and diffusion layers 42a to 42f are of the same conductive type, which is the reverse of the conductive type of channel regions 32a to 32f.

In FIG. 9B, for the sake of convenience of description, diffusion layers 52a to 52g have been described separately. These diffusion layers are continuously formed and integrated. Hereinafter, the diffusion layer including diffusion layers 52a to 52g will collectively be referred to as diffusion layer 52.

Referring again to FIG. 9A, diffusion layer 42a is connected to wiring 72a via contact plug 62a. Likewise, diffusion layers 42b to 42f are connected to wirings 72b to 72f via contact plugs 62b to 62f, respectively. Diffusion layer 52 is connected to wiring 72g via contact plugs 62.

Wiring 72a is connected to terminal A1. Gate electrodes 22a to 22c are connected to terminal A1. As described above, gate electrodes 22a to 22c are connected to gate electrodes 22d to 22f, respectively. Accordingly, gate electrodes 22a to 22f come to be at the same potential.

Wiring 72b is connected to terminal A2. Likewise, wirings 72c to 72f are connected to terminals A3 to A6, respectively.

Wiring 72g is connected to power source potential VDD or ground potential VSS. Diffusion layer 52 connected to wiring 72g becomes the source diffusion layer by connecting wiring 72g to power source potential VDD or ground potential VSS. Hereinafter, diffusion layer 52 (52a to 52g) will be referred to as source diffusion layer 52 (52a to 52g). Diffusion layers 42a to 42f connected to respective wirings 72a to 72f will be referred to as drain diffusion layers 42a to 42f.

As described with reference to FIGS. 9A and 9B, semiconductor device 3 includes transistors Tr1 to Tr6 arranged along intersecting two rows and three columns. The method of arranging transistors along intersecting rows and columns will hereinafter be referred to as a matrix arrangement.

The gates of transistors Tr1 to Tr6 come to be at the same potential. The sources of transistors Tr1 to Tr6 is connected with power source potential VDD or ground potential VSS. The drain of transistor Tr1 is connected with the gates of transistors Tr1 to Tr6 and terminal A1. The drains of transistors Tr2 to Tr6 are connected with terminals A2 to A6, respectively. The connection relationship between transistors Tr1 to Tr6 is identical to that of the transistor group of the current mirror circuit shown in FIG. 8. Accordingly, semiconductor device 3 of this exemplary embodiment corresponds to the current mirror circuit shown in FIG. 8.

The configuration of semiconductor device 3 has been described with reference to FIGS. 9A and 9B. Characteristic points of this configuration will hereinafter be described in more detail.

Semiconductor device 3 has the following two characteristic points in its configuration.

The first characteristic point is in that source diffusion layers 52a to 52f of transistors Tr1 to Tr6 are connected to each other by forming source diffusion layer 52g. The second characteristic point is in that transistors Tr1 to Tr6 are arranged in a direction in which the carrier drift directions are in the same direction.

The first characteristic point will be described.

In semiconductor device 3, source diffusion layer 52g that extends from source diffusion layer 52a of transistor Tr1 to source diffusion layers 52b to 52f is formed. The formation of source diffusion layer 52g attains a state in which source diffusion layers 52a to 52g are continuously formed, and diffusion layer 52g connects source diffusion layers 52a to 52f to each other. That is, transistors Tr1 to Tr6 share source diffusion layer 52 including source diffusion layers 52a to 52g.

Here, the sharing of source diffusion layer 52 by transistors Tr1 to Tr6 allows the variation in contact resistance to be shared among the transistors. As a result, this allows the variation in characteristics of the transistors to be reduced.

In FIG. 9A, source diffusion layer 52 is connected with contact plugs 62. However, the number of contact plugs for supplying source diffusion layer 52 with electricity may be one. Adoption of the single contact plug for connection can eliminate the variation in characteristics of the transistors due to the variation in contact resistance.

Next, the second characteristic point will be described.

In semiconductor device 3, while the directions in which the source diffusion layers, the gate electrodes and the drain diffusion layers of transistors Tr1 to Tr6 formed in this sequence are the same, source diffusion layers 52a to 52f are connected to each other by forming source diffusion layer 52g.

Accordingly, as indicated by hollow arrows in FIG. 9A, the carrier drift directions of transistors Tr1 to Tr6 viewed on the semiconductor substrate become the same.

Here, arrangement of the transistors in the direction in which the carrier drift directions become the same reduces the variation in symmetry of the source/drain diffusion layer. The difference in threshold voltage is barely caused. The variation in characteristics of the transistors can be reduced.

Thus, semiconductor device 3 of this exemplary embodiment connects source diffusion layers 52a to 52f of transistors Tr1 to Tr6 to each other by forming source diffusion layer 52g, and transistors Tr1 to Tr6 share the source diffusion layer. Accordingly, even if the contact resistances of the contact plugs connected to the source diffusion layer vary, the variation in characteristics of the transistors can be reduced.

In semiconductor device 3 of this exemplary embodiment, transistors Tr1 to Tr6 are arranged in the direction in which the carrier drift directions become the same. Accordingly, variation in the threshold voltages among transistors is hardly caused, thereby allows the variation in characteristics of the transistors to be reduced.

In the current mirror circuit including at least three transistors, in terms of the structure, it is difficult to connect the source diffusion layers of the entire transistors to each other and cause the transistors to share the source diffusion layers. In order to align the carrier drift directions of the transistors in this situation, the configuration of routing and connecting the source diffusion layers of the transistors according to this exemplary embodiment is particularly useful.

In this exemplary embodiment, description has been made using the example of semiconductor device 3 in which transistors Tr1 to Tr6 are subjected to matrix arrangement of two rows and three columns. However, the configuration is not limited thereto.

In consideration of the limitation of the arrangement region, for instance, transistors Tr1 to Tr6 may be laterally arranged with respect to the direction in which the gate electrode extends. FIGS. 10A and 10B show a configuration of such semiconductor device 4. FIG. 10A is a plan view of semiconductor device 4. FIG. 10B is a plan view of a substrate surface of semiconductor device 4. In FIGS. 10A and 10B, configurational elements corresponding to those in FIGS. 9A and 9B are assigned with the identical symbols. Description thereof is omitted.

As shown in FIG. 10A, semiconductor device 4 includes transistors Tr1 to Tr6 arranged laterally adjacent to each other with respect to the direction in which the gate electrode extends. Diffusion layers are formed in the right and left regions of gate electrodes 22a to 22f of transistors Tr1 to Tr6.

The details of the diffusion layers formed on the semiconductor substrate surface of semiconductor device 4 will be described with reference to FIG. 10B.

Referring to FIG. 10B, channel regions 32a to 32f are regions among active regions ACT immediately below gate electrodes 22a to 22f shown in FIG. 10A. Diffusion layers 42a and 52a are formed so as to be laterally adjacent to channel region 32a in active regions ACT. Diffusion layers 42b and 52b are formed so as to be laterally adjacent to channel region 32b in active regions ACT. Diffusion layers 42c and 52c are formed so as to be laterally adjacent to channel region 32c in active regions ACT. Diffusion layers 42d and 52d are formed so as to be laterally adjacent to channel region 32d in active regions ACT. Diffusion layers 42e and 52e are formed so as to be laterally adjacent to channel region 32e in active regions ACT. Diffusion layers 42f and 52f are formed so as to be laterally adjacent to channel region 32f in active regions ACT. The adjacent diffusion layers 42 and 52 are separated by an element separation region.

Further, in semiconductor device 4, diffusion layer 52h is formed so as to protrude from a part of diffusion layer 52a, be separated from diffusion layers 42a to 42f by the element separation region, and extend to diffusion layers 52b to 52f. The formation of diffusion layer 52h attains a state in which diffusion layers 52a to 52f and 52h are continuously formed, and diffusion layer 52h connects diffusion layers 52a to 52f to each other. The shape of diffusion layer 52h is not limited to that shown in FIG. 10B. Any shape may be adopted provided that diffusion layer 52h is not connected to diffusion layers 41a to 41f and diffusion layer 52h extends from diffusion layer 52a to diffusion layers 52b to 52f.

Here, diffusion layers 52a to 52f, diffusion layer 52h that connects these diffusion layers, and diffusion layers 42a to 42f are of the same conductive type, which is the reverse of the conductive type of the channel regions 32a to 32f.

In FIG. 10B, for the sake of convenience of description, diffusion layers 52a to 52f and 52h have been described separately. However, these diffusion layers are continuously formed and integrated. Hereinafter, the diffusion layer including diffusion layers 52a to 52f and 52h will collectively be referred to as diffusion layer 52.

Referring again to FIG. 10A, diffusion layer 52 is connected to wiring 72g via contact plugs 62.

Wiring 72g is connected to power source potential VDD or ground potential VSS. Diffusion layer 52 connected to wiring 72g becomes a source diffusion layer by connecting wiring 72g to power source potential VDD or ground potential VSS. Diffusion layer 52 (52h) will hereinafter be referred to as source diffusion layer 52 (52h).

As described with reference to FIGS. 10A and 10B, semiconductor device 4 includes transistors Tr1 to Tr6 laterally arranged in one column with respect to the direction in which the gate electrode extends.

The gates of transistors Tr1 to Tr6 are connected to each other. The sources transistors Tr1 to Tr6 are connected with power source potential VDD or ground potential VSS. The drain of transistor Tr1 is connected with the gates of transistors Tr1 to Tr6 and terminal A1. The drains of transistors Tr2 to Tr6 are connected with terminals A2 to A6, respectively. The connection relationship between transistors Tr1 to Tr6 is identical to that of the transistor group of the current mirror circuit shown in FIG. 8. Accordingly, semiconductor device 4 corresponds to the current mirror circuit shown in FIG. 8.

Figure 11A:
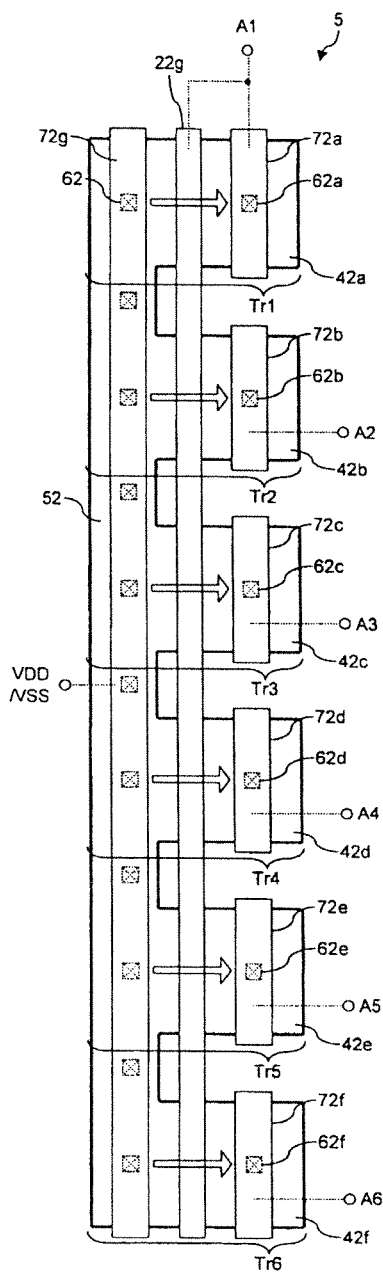
FIG. 11A is a plan view showing still another configuration of a semiconductor device of the second exemplary embodiment.
Figure 11B:
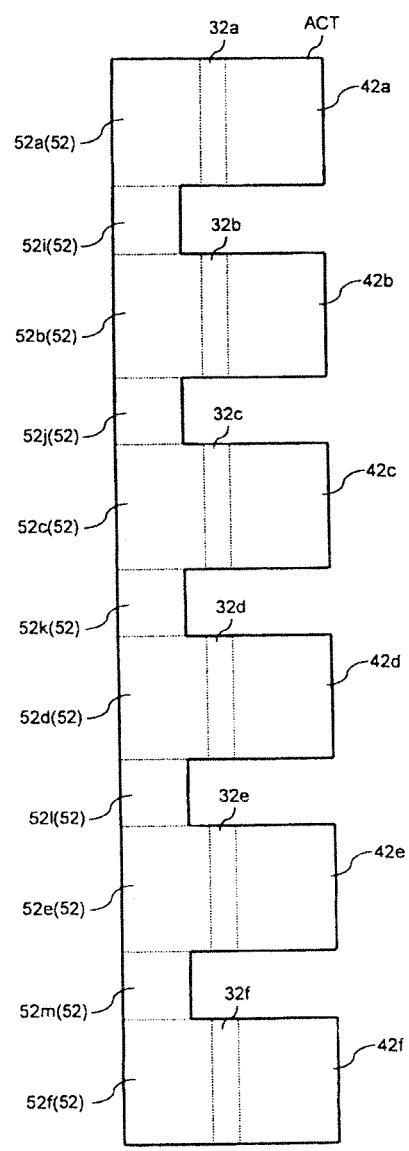
FIG. 11B is a plan view of a substrate surface of the semiconductor device shown in FIG. 11A.

Transistors Tr1 to Tr6 may be arranged so as to be vertically adjacent to each other with respect to the direction in which the gate electrode extends. FIGS. 11A and 11B show such a configuration of semiconductor device 5. FIG. 11A is a plan view of semiconductor device 5. FIG. 11B is a plan view of a substrate surface of semiconductor device 5. In 11A and 11B, configurational elements corresponding to those in 9A and 9B are assigned with identical symbols. Description thereof is omitted.

As shown in FIG. 11A, semiconductor device 5 includes transistors Tr1 to Tr6 that share gate electrode 22g and are arranged so as to be vertically adjacent to each other with respect to the direction in which gate electrode 22g extends. Diffusion layers are formed in right and left regions of gate electrode 22g.

The details of the diffusion layers formed on the semiconductor substrate surface of semiconductor device 5 will be described with reference to FIG. 11B.

Referring to FIG. 11B, channel regions 32a to 32f are regions among active regions ACT immediately below gate electrode 22g shown in FIG. 11A. Diffusion layers 42a and 52a are formed so as to be laterally adjacent to channel region 32a in active regions ACT. Diffusion layers 42b and 52b are formed so as to be laterally adjacent to channel region 32b in active regions ACT. Diffusion layers 42c and 52c are formed so as to be laterally adjacent to channel region 32c in active regions ACT. Diffusion layers 42d and 52d are formed so as to be laterally adjacent to channel region 32d in active regions ACT. Diffusion layers 42e and 52e are formed so as to be laterally adjacent to channel region 32e in active regions ACT. Diffusion layers 42f and 52f are formed so as to be laterally adjacent to channel region 32f in active regions ACT.

Further, in semiconductor device 5, diffusion layers 52i to 52m that connect vertically adjacent diffusion layers 52a to 52f to each other are formed. The formation of diffusion layers 52i to 52m attains a state in which diffusion layers 52a to 52f and 52i to 52m are continuously formed, and diffusion layer 52i to 52m connect diffusion layers 52a to 52f to each other. The shapes of diffusion layers 52i to 52m are not limited to the shape shown in FIG. 11B. Any shape may be adopted provided that diffusion layer 52i to 52m are not connected to diffusion layers 42a to 42f and extend to vertically adjacent diffusion layers 52a to 52f.

Here diffusion layers 52a to 52f, diffusion layers 52i to 52m that connect diffusion layers 52a to 52f, and diffusion layers 42a to 42f are of the same conductive type, which is the reverse of the conductive type of channel regions 32a to 32f.

In FIG. 11B, for the sake of convenience of description, diffusion layers 52b to 52f and 52i to 52m have been described separately. However, these diffusion layers are continuously formed and integrated. Hereinafter, the diffusion layer including diffusion layers 52b to 52f and 52i to 52m will collectively be referred to as diffusion layer 52.

Referring again to FIG. 11A, diffusion layer 52 is connected to wiring 72g via contact plugs 62.

Wiring 72g is connected to power source potential VDD or ground potential VSS. Diffusion layer 52 connected to wiring 72g becomes source diffusion layer by connecting wiring 72g to power source potential VDD or ground potential VSS. Diffusion layer 52 (52i to 52m) will hereinafter be referred to as source diffusion layer 52 (52i to 52m).

As described above with reference to FIGS. 11A and 11B, semiconductor device 5 includes transistors Tr1 to Tr6 vertically arranged in one column with respect to the direction in which gate electrode 22g extends.

Since transistors Tr1 to Tr6 share gate electrode 22g, the gates of transistors Tr1 to Tr6 come to be at the same potential. The sources of transistors Tr1 to Tr6 are connected with power source potential VDD or ground potential VSS. The drain of transistor Tr1 is connected with the gates of transistors Tr1 to Tr6 and terminal A1. The drains of transistors Tr2 to Tr6 are connected with terminals A2 to A6, respectively. The connection relationship between transistors Tr1 to Tr6 is identical to that of the transistor group of the current mirror circuit shown in FIG. 8. Accordingly, semiconductor device 5 corresponds to the current mirror circuit shown in FIG. 8.

Here, in semiconductor device 4, as shown in FIG. 10B, source diffusion layers 52a to 52f are connected to each other by forming source diffusion layer 52h. In semiconductor device 4, transistors Tr1 to Tr6 share source diffusion layer 52 including source diffusion layers 52a to 52f and 52h.

In semiconductor device 5, as shown in FIG. 11B, source diffusion layers 52a to 52f are connected to each other by forming source diffusion layers 52i to 52m. In semiconductor device 5, transistors Tr1 to Tr6 share source diffusion layer 52 including source diffusion layers 52a to 52f and 52i to 52m.

That is, semiconductor devices 4 and 5 have the first characteristic point identical to that of aforementioned semiconductor device 3.

Further, in semiconductor device 4, while the directions in which the source diffusion layers, the gate electrodes and the drain diffusion layers of transistors Tr1 to Tr6 are formed in this sequence are the same, source diffusion layers 52a to 52f are connected to each other by forming source diffusion layer 52h. Accordingly, as indicated by hollow arrows in FIG. 10A, the carrier drift directions of the transistors viewed on the semiconductor substrate become the same.

In semiconductor device 5, while the directions in which the source diffusion layers, the gate electrodes and the drain diffusion layers of transistors Tr1 to Tr6 are formed in this sequence are the same, source diffusion layers 52a to 52f are connected to each other by forming source diffusion layers 52i to 52m. Accordingly, as indicated by hollow arrows in FIG. 11A, the carrier drift direction of the transistors viewed on the semiconductor substrate become the same.

That is, semiconductor devices 4 and 5 have characteristic points identical to those of the second characteristic point of aforementioned semiconductor device 3.

As described above, semiconductor device 3 has the first and second characteristic points, thereby allowing the variation in characteristics of transistors Tr1 to Tr6 to be reduced. Accordingly, as with semiconductor device 3, semiconductor devices 4 and 5 also allow the variation in characteristics of the transistors to be reduced.

As described above, the semiconductor device of this exemplary embodiment allows the variation in characteristics of the transistors to be reduced even in a case of including at least three transistors in which high ratio accuracies are required.

In the transistors arranged on the substrate, the further the distance therebetween apart, the more easily the variation in characteristics occurs. In terms of this, semiconductor device 3 can reduce the distance between the farthest transistors in comparison with semiconductor devices 4 and 5. This allows the variation in characteristics of the transistors to be further reduced.

In this exemplary embodiment, description has been made using the example of the five-output current mirror circuit. The number of outputs from the current mirror circuit is not limited to five.

Third Exemplary Embodiment

A semiconductor device of a third exemplary embodiment is different from semiconductor device 1 of the first exemplary embodiment in that the transistors configuring the pair of transistors are replaced with double gate transistors.

First, the configuration of the double gate transistor will be described.

Figure 12B:
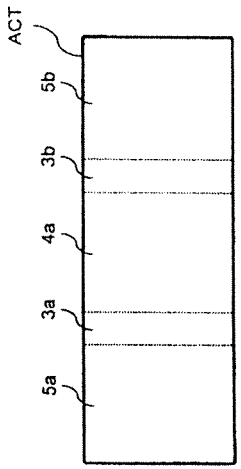
FIG. 12B is a plan view of a substrate surface of the double gate transistor shown in FIG. 12A.
Figure 12A:
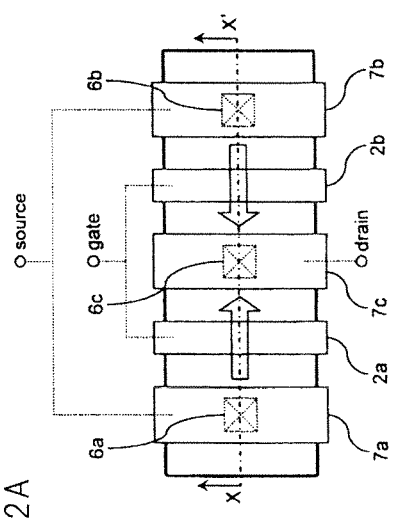
FIG. 12A is a plan view showing a configuration of a double gate transistor.
Figure 12C:
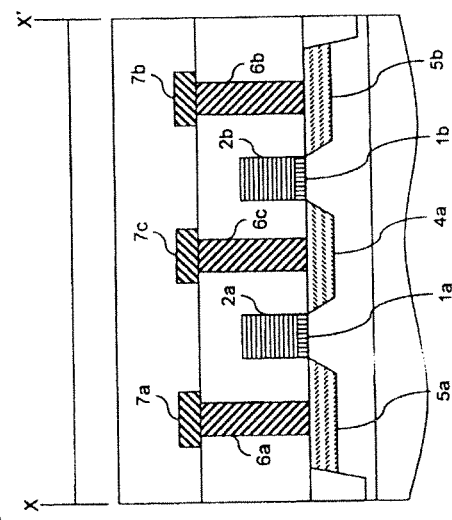
FIG. 12C is a sectional view taken along line X-X' shown in FIG. 12A.

FIG. 12A is a plan view of the double gate transistor. FIG. 12B is a plan view of a semiconductor substrate surface of the double gate transistor. FIG. 12C is a sectional view taken along line X-X' shown in FIG. 12A viewed from the arrow direction.

Referring to FIGS. 12A and 12C, gate insulation films 1a and 1b are formed on the semiconductor substrate. Gate electrodes 2a and 2b are formed on gate insulation films 1a and 1b, respectively. Diffusion layers are formed in a region sandwiched by gate electrodes 2a and 2b and in regions opposite to the region with respect to gate electrodes 2a and 2b.

The details of the diffusion layers formed on the semiconductor substrate surface will be described with reference to FIG. 12B. In FIG. 12B, regions enclosed by solid lines indicate active regions ACT. Active regions ACT are enclosed by element separation regions.

Referring to FIG. 12B, channel regions 3a and 3b are regions among active regions ACT immediately below gate electrodes 2a and 2b shown in FIG. 12A. Diffusion layer 4a is formed in a region sandwiched by channel regions 3a and 3b in active regions ACT so as to be adjacent to channel regions 3a and 3b. Further, diffusion layer 5a is formed in a region in active regions ACT opposite to the region in which diffusion layer 4a is formed beyond channel region 3a, so as to be adjacent to channel region 3a. Diffusion layer 5b is formed in a region in active regions ACT opposite to the region in which diffusion layer 4a is formed beyond channel region 3b, so as to be adjacent to channel region 3b.

Referring again to FIGS. 12A and 12C, diffusion layer 5a is connected to wiring 7a via contact plug 6a. Diffusion layer 5b is connected to wiring 7b via contact plug 6b. Diffusion layer 4a is connected to wiring 7c via contact plug 6c.

Both wirings 7a and 7b are connected to the source terminal. Diffusion layer 5a connected to wiring 7a, and diffusion layer 5b connected to wiring 7b become the source diffusion layers. Diffusion layers 5a and 5b will hereinafter be referred to as source diffusion layers 5a and 5b.

Wiring 7c is connected to the drain terminal. Diffusion layer 4a connected to wiring 7c will hereinafter be referred to as drain diffusion layer 4a.

Gate electrodes 2a and 2b are connected to the gate terminal, and come to be at the same potential.

In the aforementioned double gate transistor including two gate electrodes 2a and 2b, when a gate voltage is applied to gate electrodes 2a and 2b, carrier drift from source diffusion layer 5a to drain diffusion layer 4a and carrier drift from source diffusion layer 5b to drain diffusion layer 4a occur. The drain current due to the carrier drifts from two directions is collectively output from the drain terminal. Accordingly, although the double gate transistor includes two gate electrodes, this transistor operates as one transistor.

Next, the configuration of semiconductor device 6 of this exemplary embodiment will be described.

Figure 13A:
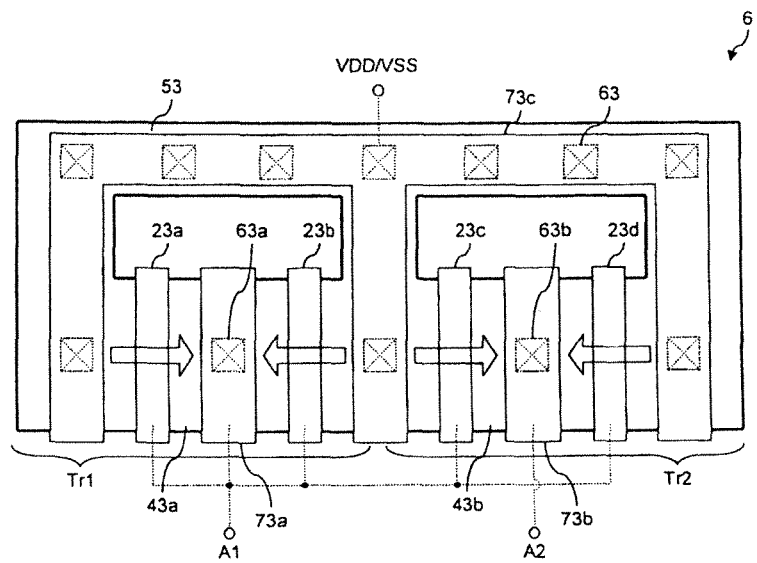
FIG. 13A is a plan view showing a configuration of a semiconductor device of a third exemplary embodiment.
Figure 13B:
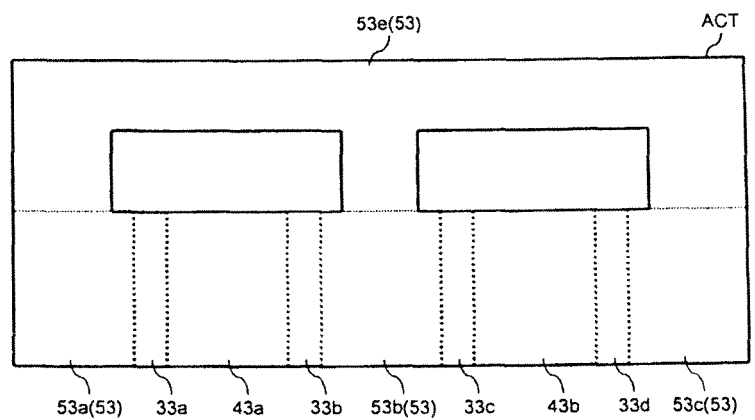
FIG. 13B is a plan view of a substrate surface of the semiconductor device shown in FIG. 13A.

FIG. 13A is a plan view of semiconductor device 6. FIG. 13B is a plan view of a substrate surface of semiconductor device 6.

Referring to FIG. 13A, semiconductor device 6 includes transistors Tr1 and Tr2, which are double gate transistors.

More specifically, gate electrodes 23a to 23d are formed on a gate insulation film, which is not shown, formed on a semiconductor substrate. Diffusion layers are formed in a region that is to the left of gate electrode 23a, in regions sandwiched by laterally adjacent gate electrodes, and in a region that is to the right of gate electrode 23d.

The details of the diffusion layer formed on the semiconductor substrate surface of semiconductor device 6 will be described with reference to FIG. 13B. In FIG. 13B, regions enclosed by solid lines indicate active regions ACT. Active regions ACT are enclosed by element separation regions.

Referring to FIG. 13B, channel regions 33a to 33d are regions among active regions ACT immediately below gate electrodes 23a to 23d shown in FIG. 13B. Diffusion layer 53a is formed in a region that is to the left of channel region 33a in active regions ACT so as to be adjacent to channel region 33a. Diffusion layer 43a is formed in a region in active regions ACT sandwiched by channel regions 33a and 33b so as to be adjacent to channel regions 33a and 33b. Diffusion layer 53b is formed in a region in active regions ACT sandwiched by channel regions 33b and 33c so as to be adjacent to channel regions 33b and 33c. Diffusion layer 43b is formed in a region in active regions ACT sandwiched by channel regions 33c and 33d so as to be adjacent to channel regions 33c and 33d. Diffusion layer 53c is formed in a region that is to the right of channel region 33d in active regions ACT so as to be adjacent to channel region 33d.

Further, in semiconductor device 6, diffusion layer 53e is formed so as to protrude from a part of diffusion layer 53a, be separated from diffusion layers 43a and 43b by element separation regions, and extends to diffusion layers 53b and 53c. The formation of diffusion layer 53e attains a state in which diffusion layers 53a to 53c and 53e are continuously formed, and diffusion layer 53e connects diffusion layers 53a to 53c to each other. The shape of diffusion layer 53e is not limited to that shown in FIG. 13B. Any shape may be adopted provided that diffusion layer 53e is not connected to diffusion layers 43a and 43b and extends to diffusion layers 53b and 53c.

Here, diffusion layers 53a to 53c, diffusion layer 53e that connects these diffusion layers, and diffusion layers 42a and 43b are of the same conductive type, which is the reverse of the conductive type of channel regions 33a to 33d.

In FIG. 13B, for the sake of convenience of description, diffusion layers 53a to 53c and 53e have been described separately. These diffusion layers are continuously formed and integrated. Hereinafter, the diffusion layer including diffusion layers 53a to 53c and 53e will be collectively referred to as diffusion layer 53.

Referring again to FIG. 13A, diffusion layer 43a is connected to wiring 73a via contact plug 63a. Diffusion layer 43b is connected to wiring 73b via contact plug 63b. Diffusion layer 53 is connected to wiring 73c via contact plugs 63.

Wiring 73a is connected to terminal A1. Gate electrodes 23a to 23d are connected to terminal A1, and come to be at the same potential.

Wiring 73b is connected to terminal A2.

Wiring 73c is connected to power source potential VDD or ground potential VSS. Diffusion layer 53 connected to wiring 73c becomes a source diffusion layer by connecting wiring 73c to power source potential VDD or ground potential VSS. Diffusion layer 53 (53a to 53c and 53e) will hereinafter be referred to as source diffusion layer 53 (53a to 53c and 53e).

Diffusion layer 43a connected to wiring 73a, and diffusion layer 43b connected to wiring 73b are referred to as drain diffusion layers 43a and 43b, respectively.

As described with reference to FIGS. 13A and 13B, semiconductor device 6 includes: the double gate transistor in which source diffusion layer 53a, gate electrode 23a, drain diffusion layer 43a, gate electrode 23b and source diffusion layer 53b are formed in this sequence; and the double gate transistor in which source diffusion layer 53b, gate electrode 23c, drain diffusion layer 43b, gate electrode 23d and source diffusion layer 53c are formed in this sequence.

As described above, the double gate transistor operates as one transistor. Accordingly, hereinafter, the double gate transistor including gate electrodes 23a and 23b is referred to as transistor Tr1, and the double gate transistor including gate electrodes 23c and 23d is referred to as transistor Tr2.

The gates of transistors Tr1 and Tr2 are connected to each other. The sources of transistors Tr1 and Tr2 are connected with power source potential VDD or ground potential VSS. The drain of transistor Tr1 is connected with the gates of transistors Tr1 and Tr2 and terminal A1. The drain of transistor Tr2 is connected with terminal A2. The connection relationship between transistors Tr1 and Tr2 is identical to that of the pair of transistors of the current mirror circuit shown in FIG. 1. Accordingly, semiconductor device 6 shown in FIGS. 13A and 13B corresponds to the current mirror circuit shown in FIG. 1.

The configuration of semiconductor device 6 has been described above with reference to FIGS. 13A and 13B. The characteristic points of the configuration will hereinafter be described in detail.

In terms of the configuration, semiconductor device 6 has the following two characteristic points.

A first characteristic point is that source diffusion layers 53a to 53c of transistors Tr1 and Tr2 are connected to each other by forming diffusion layer 53e. A second characteristic point is that transistors Tr1 and Tr2 are arranged in the direction in which carrier drift directions become the same.

First, the first characteristic point will be described.

In semiconductor device 6, source diffusion layer 53e extending from source diffusion layer 53a to diffusion layers 53b and 53c is formed. The formation of source diffusion layer 53e attains a state in which source diffusion layers 53a to 53c and 53e are continuously formed, and diffusion layer 53e connects source diffusion layers 53a to 53c to each other. That is, transistors Tr1 and Tr2 share source diffusion layer 53 including source diffusion layers 53a to 53c and 53e.

The sharing of source diffusion layer 53 by transistors Tr1 and Tr2 allows the variation in contact resistance to be shared among the transistors. As a result, this allows the variation in characteristics of the transistors to be reduced.

In FIG. 13A, source diffusion layer 53 is connected with contact plugs 63. However, the number of contact plugs for supplying source diffusion layer 53 with electricity may be one. Adoption of the single contact plug for connection can eliminate the variation in characteristics of the transistors due to the variation in contact resistance.

Next, the second characteristic point will be described.

In semiconductor device 6, while the directions in which the source diffusion layers, the gate electrodes, the drain diffusion layers, the gate electrodes, the source diffusion layers of transistors Tr1 and Tr2 are formed in this sequence are the same, source diffusion layers 53a to 53c are connected to each other by forming source diffusion layer 53e.

That is, semiconductor device 6 includes: transistor Tr1 in which source diffusion layer 53a as the first diffusion layer, gate electrode 23a as a first control electrode, drain diffusion layer 43a as a second diffusion layer, gate electrode 23b as a third control electrode, and source diffusion layer 53b as a sixth diffusion layer are sequentially formed in a first direction; transistor Tr2 in which source diffusion layer 53b as a third diffusion layer, gate electrode 23c as a second control electrode, drain diffusion layer 43b as a fourth diffusion layer, gate electrode 23d as a fourth control electrode, and source diffusion layer 53c as a seventh diffusion layer are sequentially formed in the first direction; and source diffusion layer 53e as a fifth diffusion layer connecting source diffusion layers 53a to 53c, wherein the source diffusion layers, the gate electrodes, the drain diffusion layers, the gate electrodes, and the source diffusion layers of transistors Tr1 and Tr2 are sequentially formed in the same direction (first direction).

Accordingly, as indicated by hollow arrows in FIG. 13A, carrier drift directions of transistors Tr1 and Tr2 viewed on the semiconductor substrate become the same. As described above, in double gate transistor, the carrier drift directions are two directions, which are a direction from one source diffusion layers to the drain diffusion layer and a direction from the other source diffusion layers to the drain diffusion layer. Transistors Tr1 and Tr2 are arranged such that the carrier drift directions from the one source diffusion layer to the drain diffusion layer are the same and the carrier drift directions from the other source diffusion layer to the drain diffusion layer are the same.

Since transistors Tr1 and Tr2 are thus arranged such that the carrier drift directions are the same, the variation in symmetry of the source/drain diffusion layer of each transistor is reduced, a difference in threshold voltage is barely caused, and the variation in characteristics of each transistor can be reduced.

As described above, semiconductor device 6 of this exemplary embodiment allows the variation in characteristics of each transistor to be reduced even in a case where the transistors of the pair of transistors requiring high ratio accuracies are double gate transistors.

In this exemplary embodiment, description has been made using the example of semiconductor device 6 in which transistors Tr1 and Tr2 are arranged so as to be laterally adjacent to each other with respect to the direction in which the gate electrode extends. However, the arrangement is not limited thereto.

Figure 14B:
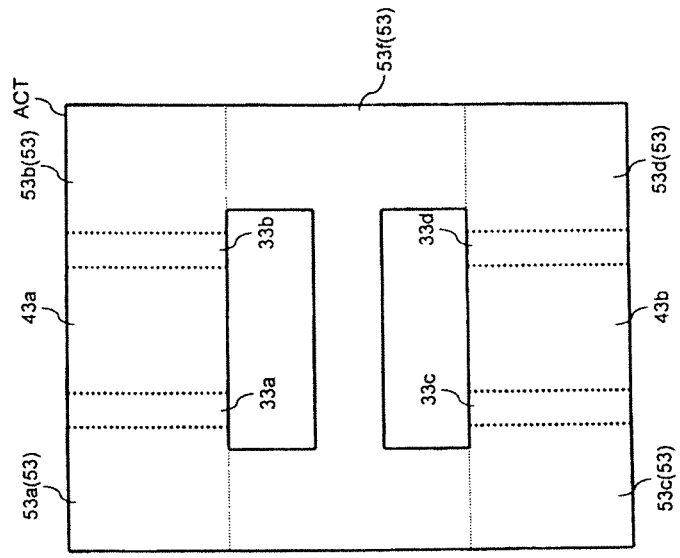
FIG. 14B is a plan view of a substrate surface of the semiconductor device shown in FIG. 14A.
Figure 14A:
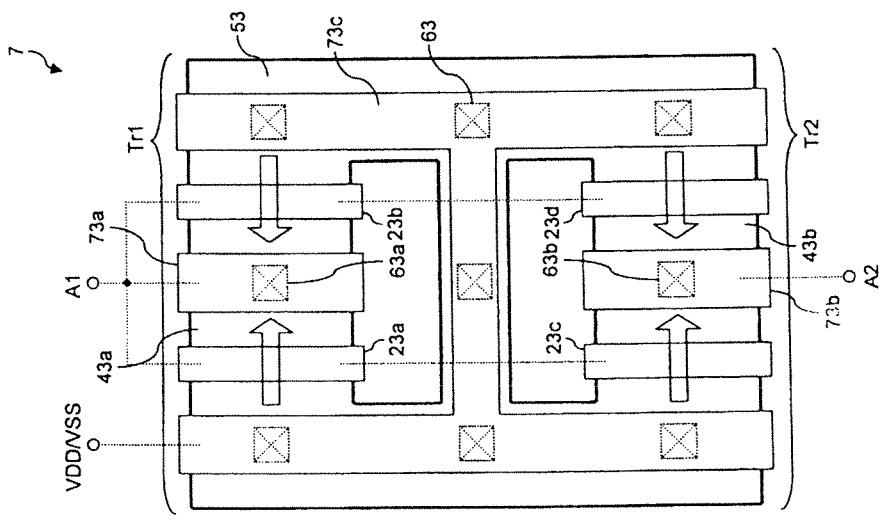
FIG. 14A is a plan view showing another configuration of a semiconductor device of the third exemplary embodiment.

For instance, transistors Tr1 and Tr2 may be arranged so as to be vertically adjacent to each other with respect to the direction in which the gate electrode extends. FIGS. 14A and 14B show such a configuration of semiconductor device 7. FIG. 14A is a plan view of semiconductor device 7. FIG. 14B shows a plan view of a substrate surface of semiconductor device 7. In FIGS. 14A and 14B, configurational elements corresponding to those in FIGS. 13A and 13B are assigned with the identical symbols. Description thereof is omitted.

As shown in FIG. 14A, semiconductor device 7 includes transistors Tr1 and Tr2 arranged so as to be vertically adjacent to each other with respect to the direction in which the gate electrode extends. Gate electrode 23a of transistor Tr1 and the gate electrode 23c of transistor Tr2 are connected to each other. Gate electrode 23b of transistor Tr1 and the gate electrode 23d of transistor Tr2 are connected to each other. Diffusion layers are formed in regions sandwiched by gate electrodes 23a and 23b and in regions opposite to the respective regions over gate electrodes 23a and 23b. Diffusion layers are also formed in regions sandwiched by gate electrodes 23c and 23d and in regions opposite to the respective regions over gate electrodes 23c and 23d.

The details of the diffusion layers formed on the semiconductor substrate surface of semiconductor device 7 will be described with reference to FIG. 14B.

Referring to FIG. 14B, channel regions 33a to 33d are regions among active regions ACT immediately below gate electrodes 23a to 23d shown in FIG. 14A. Diffusion layer 43a is formed in a region among active regions ACT sandwiched by channel regions 33a and 33b so as to be adjacent to channel regions 33a and 33b. Diffusion layer 53a is formed in a region among active regions ACT opposite to the region in which diffusion layer 43a is formed over channel region 33a so as to be adjacent to channel region 33a. Diffusion layer 53b is formed among active regions ACT opposite to the region in which diffusion layer 43a is formed over channel region 33b so as to be adjacent to channel region 33b. Diffusion layer 43b is formed in a region among active regions ACT sandwiched by channel regions 33c and 33d so as to be adjacent to channel regions 33c and 33d. Diffusion layer 53c is formed in a region among active regions ACT opposite to the region in which diffusion layer 43b is formed over channel region 33c so as to be adjacent to channel region 33c. Diffusion layer 53d is formed in a region among active regions ACT opposite to the region in which diffusion layer 43b is formed over channel region 33d so as to be adjacent to channel region 33d.

Further, in semiconductor device 7, diffusion layer 53f is formed so as to protrude from a part of diffusion layer 53a, be separated from diffusion layers 43a and 43b by element separation regions, and extends to diffusion layers 53b, 53c and 53d. The formation of diffusion layer 53f attains a state in which diffusion layers 53a to 53d and 53f are continuously formed, and diffusion layer 53f connects diffusion layers 53a to 53d to each other. The shape of diffusion layer 53f is not limited to that shown in FIG. 14B. Any shape may be adopted provided that diffusion layer 53f is not connected to diffusion layers 43a and 43b and extends from diffusion layer 53a to diffusion layers 53b, 53c and 53d.

Here, diffusion layers 53a to 53d, diffusion layer 53f that connects these diffusion layers, and diffusion layers 43a and 43b are of the same conductive type, which is the reverse of the conductive type of channel regions 33a to 33d.

In FIG. 14B, for the sake of convenience of description, diffusion layers 53a to 53d and 53f have been described separately. However, these diffusion layers are continuously formed and integrated. Hereinafter, the diffusion layer including diffusion layers 53a to 53d and 53f will be collectively referred to as diffusion layer 53.

Referring again to FIG. 14A, diffusion layer 53 is connected to wiring 73c via contact plugs 63.

Wiring 73c is connected to terminal A1. Gate electrodes 23a and 23b are connected to terminal A1. As described above, gate electrodes 23a and 23c are connected to each other, and gate electrodes 23b and 23d are connected to each other. Accordingly, gate electrodes 23a to 23d come to be at the same potential.

Wiring 73c is connected to power source potential VDD or ground potential VSS. Diffusion layer 53 connected to wiring 73c becomes the source diffusion layer by connecting wiring 73c to power source potential VDD or ground potential VSS. Diffusion layer 53 (53f) will hereinafter be referred to as source diffusion layer 53 (53f).

As described above with reference to FIGS. 14A and 14B, semiconductor device 7 includes: transistor Tr1 and Tr2 arranged so as to vertically adjacent to each other. Transistor Tr1 is the double gate transistor, which includes source diffusion layer 53a, gate electrode 23a, drain diffusion layer 43a, gate electrode 23b, and source diffusion layer 53b. Transistor Tr2 is the double gate transistor, which includes source diffusion layer 53c, gate electrode 23c, drain diffusion layer 43c, gate electrode 23d, and source diffusion layer 53d.

The gates of transistors Tr1 and Tr2 are at the same potential. The sources of transistors Tr1 and Tr2 are connected with power source potential VDD or ground potential VSS. The drain of transistor Tr1 is connected with the gates of transistors Tr1 and Tr2 and terminal A1. The drain of transistor Tr2 is connected with terminal A2. The connection relationship between transistors Tr1 and Tr2 is identical to that of the pair of transistors of the current mirror circuit shown in FIG. 1. Accordingly, semiconductor device 7 shown in FIGS. 14A and 14B corresponds to the current mirror circuit shown in FIG. 1.

Figure 15B:
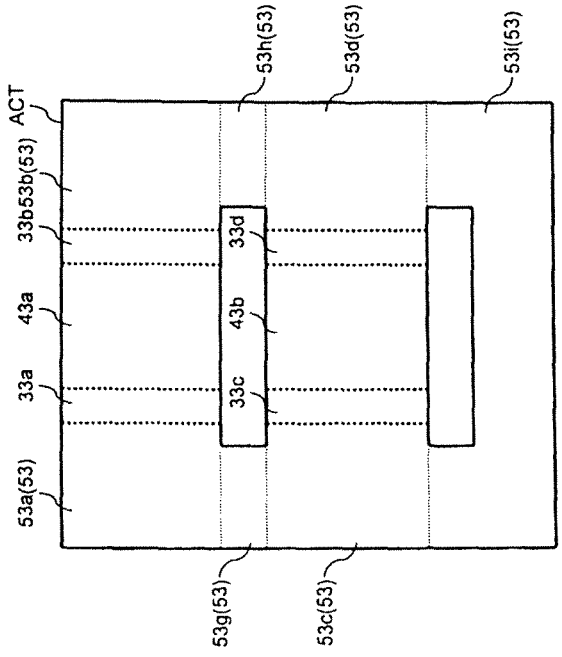
FIG. 15B is a plan view of a substrate surface of the semiconductor device shown in FIG. 15A.
Figure 15A:
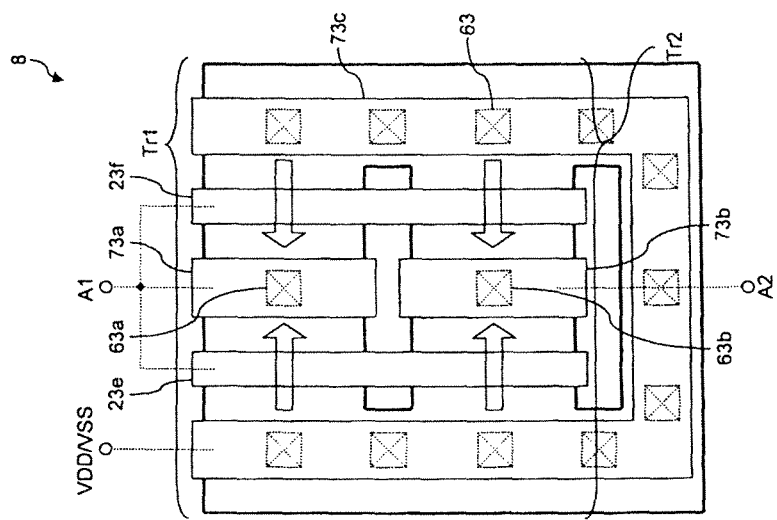
FIG. 15A is a plan view showing still another configuration of a semiconductor device of the third exemplary embodiment.

FIGS. 15A and 15B are diagrams showing a configuration of semiconductor device 8 that is different from that of semiconductor device 7 in which transistors Tr1 and Tr2 are averaged to be vertically adjacent to each other with respect to the direction in which the gate electrode extends. FIG. 15A shows a plan view of semiconductor device 8. FIG. 15B shows a plan view of a substrate surface of semiconductor device 8. In FIGS. 15A and 15B, configurational elements corresponding to those in FIGS. 13A and 13B are assigned with the identical symbols. Description thereof is omitted.

As shown in FIG. 15A, semiconductor device 8 includes transistors Tr1 and Tr2 that share gate electrodes 23e and 23f and are vertically adjacent to each other with respect to the direction in which the gate electrode extends. Diffusion layers are formed in regions sandwiched by gate electrodes 23e and 23f, and in regions opposite to these regions over respective gate electrodes 23e and 23f.

The details of the diffusion layers formed on the semiconductor substrate surface of semiconductor device 8 will be described with reference to FIG. 15B.

Referring to FIG. 15B, channel regions 33a and 33c are regions among active regions ACT immediately below gate electrode 23e shown in FIG. 15A. Channel regions 33b and 33d are regions among active regions ACT immediately below gate electrode 23f shown in FIG. 15A. Diffusion layer 43a is formed in a region among active regions ACT sandwiched by channel regions 33a and 33b so as to be adjacent to channel regions 33a and 33b. Diffusion layer 53a is formed in a region among active regions ACT opposite to the region in which diffusion layer 43a is formed over channel region 33a so as to be adjacent to channel region 33a. Diffusion layer 53b is formed in a region among active regions ACT opposite to the region in which diffusion layer 43a is formed over channel region 33b so as to be adjacent to channel region 33b. Diffusion layer 43b is formed in a region among active regions ACT sandwiched by channel regions 33c and 33d so as to be adjacent to channel regions 33c and 33d. Diffusion layer 53c is formed in a region among active regions ACT opposite to the region in which diffusion layer 43b is formed over channel region 33c so as to be adjacent to channel region 33c. Diffusion layer 53d is formed in a region among active regions ACT opposite to the region in which diffusion layer 43b is formed over channel region 33d so as to be adjacent to channel region 33d.

Further, in semiconductor device 8, diffusion layer 53g that protrudes from a part of diffusion layer 53a and extends to diffusion layer 53c so as to be separated from diffusion layers 43a and 43b by element separation regions, diffusion layer 53h that protrudes from a part of diffusion layer 53b and extends to diffusion layer 53d, and diffusion layer 53i that protrudes from a part of diffusion layer 53c and extends to diffusion layer 53d, are formed. The formation of diffusion layers 53g to 53i attains a state in which diffusion layers 53a to 53d and 53g to 53i are continuously formed, and diffusion layer 53g to 53i connect diffusion layers 53a to 53d to each other. The shapes of diffusion layers 53g to 53i are not limited to the shape shown in FIG. 15B. Any shape may be adopted provided that diffusion layer 53g to 53i are not connected to diffusion layers 43a and 43b and extend from diffusion layer 53a to diffusion layer 53c, from diffusion layer 53b to diffusion layer 53d, and from diffusion layer 53c to diffusion layer 53d.

Here, diffusion layers 53a to 53d, diffusion layers 53g to 53i that connect diffusion layers 53a to 53d, and diffusion layers 43a and 43b are of the same conductive type, which is the reverse of the conductive type of channel regions 33a to 33d.

In FIG. 15B, for the sake of convenience of description, diffusion layers 53a to 53d and 53g to 53i have been described separately. However, these diffusion layers are continuously formed and integrated. Hereinafter, the diffusion layer including diffusion layers 53a to 53d and 53g to 53i will be collectively referred to as diffusion layer 53.

Referring again to FIG. 15A, diffusion layer 53 is connected to wiring 73c via contact plugs 63.

Wiring 73c is connected to terminal A1. Gate electrodes 23e and 23f are connected to terminal A1 and come to be the same potential.

Wiring 73c is connected to power source potential VDD or ground potential VSS. Diffusion layer 53 connected to wiring 73c becomes a source diffusion layer by connecting wiring 73c to power source potential VDD or ground potential VSS. Diffusion layer 53 (53g to 53i) will hereinafter be referred to as source diffusion layer 53 (53g to 53i).

As described with reference to FIGS. 15A and 15B, semiconductor device 8 includes: transistor Tr1 and Tr2 arranged so as to be vertically adjacent to each other. Transistor Tr1 is a double gate transistor, which includes source diffusion layer 53a, gate electrode 23a, drain diffusion layer 43a, gate electrode 23b, and source diffusion layer 53b. Transistor Tr2 is a double gate transistor, which includes source diffusion layer 53c, gate electrode 23c, drain diffusion layer 43c, gate electrode 23d, and source diffusion layer 53d.

The gates of transistors Tr1 and Tr2 are connected to each other. The sources of transistors Tr1 and Tr2 are connected with power source potential VDD or ground potential VSS. The drain of transistor Tr1 is connected with the gates of transistors Tr1 and Tr2 and terminal A1. The drain of transistor Tr2 is connected with terminal A2. The connection relationship between transistors Tr1 and Tr2 is identical to that of the pair of transistors of the current mirror circuit shown in FIG. 1. Accordingly, semiconductor device 8 corresponds to the current mirror circuit shown in FIG. 1.

Here, in semiconductor device 7, as shown in FIG. 14B, source diffusion layers 53a to 53d are connected to each other by forming source diffusion layer 53f. In semiconductor device 7, transistors Tr1 and Tr2 share source diffusion layer 53 including source diffusion layers 53a to 53d and 53f.

In semiconductor device 8, as shown in FIG. 15B, source diffusion layers 53a to 53d are connected to each other by forming source diffusion layers 53g to 53i. In semiconductor device 8, transistors Tr1 and Tr2 share source diffusion layer 53 including source diffusion layers 53a to 53d and 53g to 53i.

That is, semiconductor devices 7 and 8 have characteristics identical to those of the aforementioned first characteristic point of semiconductor device 6.

Further, in semiconductor device 7, while the directions in which the source diffusion layers, the gate electrodes, the drain diffusion layers, the gate electrodes and the source diffusion layers of transistors Tr1 and Tr2 are formed in this sequence are the same, source diffusion layers 53a to 53d are connected to each other by forming source diffusion layer 53f. Accordingly, as indicated by hollow arrows in FIG. 14A, the carrier drift directions of the transistors viewed on the semiconductor substrate become the same.

In semiconductor device 8, while the directions in which the source diffusion layers, the gate electrodes, the drain diffusion layers, the gate electrodes and the source diffusion layers of transistors Tr1 and Tr2 are formed in this sequence are the same, source diffusion layers 53a to 53d are connected to each other by forming source diffusion layers 53g to 53i. Accordingly, as indicated by hollow arrows in FIG. 15A, the carrier drift directions of transistors Tr1 and Tr2 viewed on the semiconductor substrate become the same.

That is, semiconductor devices 7 and 8 have characteristics identical to the aforementioned second characteristic point of semiconductor device 6.

As described above, semiconductor device 6 thus has the first and second characteristic points, thereby allowing the variation in characteristics of transistors Tr1 and Tr2 to be reduced. Accordingly, semiconductor devices 7 and 8 can also reduce the variations in characteristics of the transistors as with semiconductor device 6.

Fourth Exemplary Embodiment

A semiconductor device of a fourth exemplary embodiment is different from semiconductor device 3 of the second exemplary embodiment in that the transistors configuring the transistor group are replaced with double gate transistors.

Figure 16A:
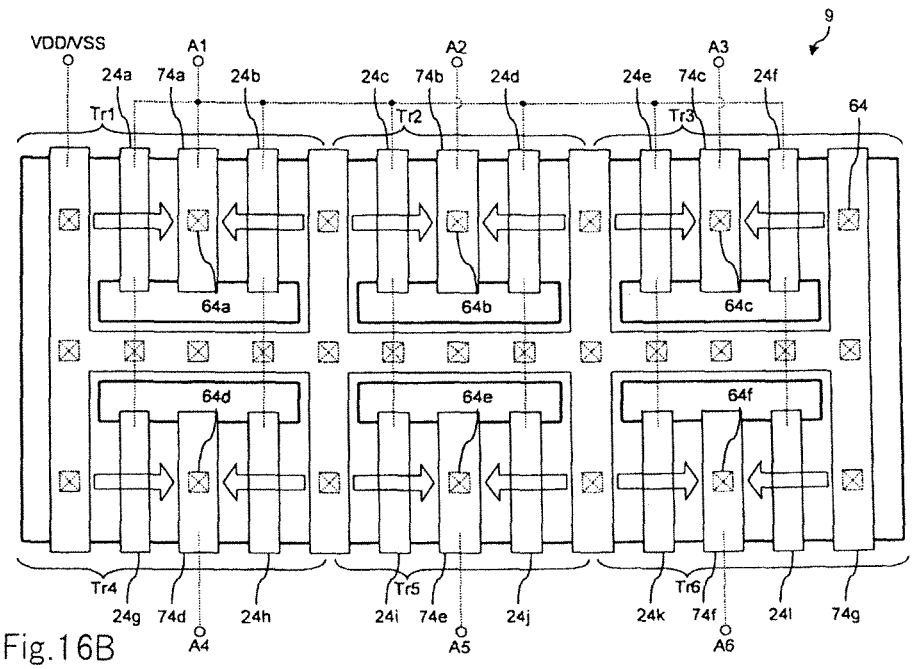
FIG. 16A is a plan view showing a configuration of a semiconductor device of a fourth exemplary embodiment.
Figure 16B:
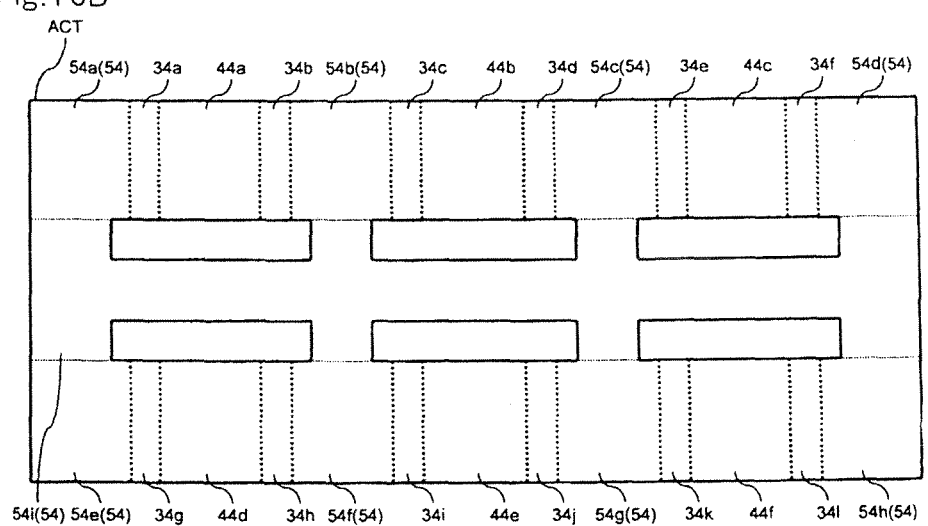
FIG. 16B is a plan view of a substrate surface of the semiconductor device shown in FIG. 16A.

The configuration of semiconductor device 9 of this exemplary embodiment will be described with reference to FIGS. 16A and 16B. FIG. 16A is a plan view of semiconductor device 9. FIG. 16B is a plan view of a substrate surface of semiconductor device 9.

Referring to FIG. 16A, semiconductor device 9 includes transistors Tr1 to Tr6, which are double gate transistors arranged in a matrix arrangement of two rows and three columns.

More specifically, gate electrodes 24a to 24l are formed on a gate insulation film, which is not shown, on a semiconductor substrate. Gate electrodes 24a and 24g are connected to each other. Gate electrodes 24b and 24h are connected to each other. Gate electrodes 24c and 24i are connected to each other. Gate electrodes 24d and 24j are connected to each other. Gate electrodes 24e and 24k are connected to each other. Gate electrodes 24f and 24l are connected to each other. Diffusion layers are formed in regions that are to the left of 24a and 24g, regions sandwiched by laterally adjacent gate electrodes, regions that are to the right of gate electrodes 24f and 24l.

The details of the diffusion layers formed on the semiconductor substrate surface of semiconductor device 9 will be described with reference to FIG. 16B. In FIG. 16B, regions enclosed by solid lines indicate active regions ACT. Active regions ACT are enclosed by element separation regions.

Referring to FIG. 16B, channel regions 34a to 34l are regions among active regions ACT immediately below gate electrodes 24a to 24l shown in FIG. 16A. Diffusion layer 54a is formed in a region that is to the left of channel region 34a among active regions ACT so as to be adjacent to channel region 34a. Diffusion layer 44a are formed in a region among active regions ACT sandwiched by channel regions 34a and 34b so as to be adjacent to channel regions 34a and 34b. Diffusion layer 54b is formed in a region among active regions ACT sandwiched by channel regions 34b and 34c so as to be adjacent to channel regions 34b and 34c. Diffusion layer 44b is formed in a region among active regions ACT sandwiched by channel regions 34c and 34d so as to be adjacent to channel regions 34c and 34d. Diffusion layer 54c is formed in a region among active regions ACT sandwiched by channel regions 34d and 34e so as to be adjacent to channel regions 34d and 34e. Diffusion layer 44c is formed in a region among active regions ACT sandwiched by channel regions 34e and 34f so as to be adjacent to channel regions 34e and 34f. Diffusion layer 54d is formed in a region that is to the right of the channel region 34f among active regions ACT so as to be adjacent to channel region 34f. Diffusion layer 54e is formed in a region that is to the left of the channel region 34g among active regions ACT so as to be adjacent to channel region 34g. Diffusion layer 44d is formed in a region among active regions ACT sandwiched by channel regions 34g and 34h so as to be adjacent to channel regions 34g and 34h. Diffusion layer 54f is formed in a region among active regions ACT sandwiched by channel regions 34h and 34i so as to be adjacent to channel regions 34h and 34i. Diffusion layer 44e is formed in a region among active regions ACT sandwiched by channel regions 34i and 34j so as to be adjacent to channel regions 34i and 34j. Diffusion layer 54g is formed in a region among active regions ACT sandwiched by channel regions 34j and 34k so as to be adjacent to channel regions 34j and 34k. Diffusion layer 44f is formed in a region among active regions ACT sandwiched by channel regions 34k and 34l so as to be adjacent to channel regions 34k and 34l. Diffusion layer 54h is formed in a region that is to the right of the channel region 34l among active regions ACT so as to be adjacent to channel region 34l.

Further, in semiconductor device 9, diffusion layer 54i is formed so as to protrude from a part of diffusion layer 54a, be separated from diffusion layers 44a to 44f by element separation regions, and extends to diffusion layers 54b to 54h. The formation of diffusion layer 54i attains a state in which diffusion layers 54a to 54i are continuously formed, and diffusion layer 54i connects diffusion layers 54a to 54h to each other. The shape of diffusion layer 54i is not limited to that shown in FIG. 16B. Any shape may be adopted provided that diffusion layer 54i is not connected to diffusion layers 44a to 44f and extends to diffusion layers 54b to 54h.

Here, diffusion layers 54a to 54h, diffusion layer 54i that connects these diffusion layers to each other, and diffusion layers 44a to 44f are of the same conductive type, which is the reverse of the conductive type of channel regions 34a to 34l.

In FIG. 16B, for the sake of convenience of description, diffusion layers 54a to 54i have been described separately. However, these diffusion layers are continuously formed and integrated. Hereinafter, the diffusion layer including diffusion layers 54a to 54i are collectively referred to as diffusion layer 54.

Referring again to FIG. 16A, diffusion layers 44a to 44f are connected to wirings 74a to 74f via contact plugs 64a to 64f, respectively. Diffusion layer 54 is connected to wiring 74g via contact plugs 64.

Wiring 74a is connected to terminal A1. Gate electrodes 24a to 24f are connected to terminal A1. As described above, gate electrodes 24a to 24f are connected to gate electrodes 24g to 24l, respectively. Accordingly, gate electrodes 24a to 24l come to be at the same potential.

Wirings 74b to 74f are connected to terminals A2 to A6, respectively.

Wiring 74g is connected to power source potential VDD or ground potential VSS. Diffusion layer 54 connected to wiring 74g becomes a source diffusion layer by connecting wiring 74g to power source potential VDD or ground potential VSS. Diffusion layer 54 (54a to 54i) will hereinafter be referred to as source diffusion layer 54 (54a to 54i). Diffusion layers 44a to 44f that are connected to respective wirings 74a to 74f will be referred to as drain diffusion layers 44a to 44f.

As described with reference to FIGS. 16A and 16B, semiconductor device 9 includes transistors Tr1 to Tr6 that are double gate transistors including the source diffusion layer, the gate electrode, the drain diffusion layer, the gate electrode and the source diffusion layer.

The gates of transistors Tr1 to Tr6 are at the same potential. The source is connected with power source potential VDD or ground potential VSS. The drain of transistor Tr1 is connected with the gates of transistors Tr1 to Tr6 and terminal A1. The drains of transistors Tr2 to Tr6 are connected with terminals A2 to A6, respectively. The connection relationship between transistors Tr1 to Tr6 is identical to that of the transistor group of the current mirror circuit shown in FIG. 8. Accordingly, semiconductor device 9 corresponds to the current mirror circuit shown in FIG. 8.

The configuration of semiconductor device 9 of this exemplary embodiment has been described above with reference to FIGS. 16A and 16B. The characteristic points in this configuration will hereinafter be described in more detail.

Semiconductor device 9 has the following two characteristic points in terms of the configuration.

A first characteristic point is that the source diffusion layers 54a to 54h of transistors Tr1 to Tr6 are connected to each other by forming source diffusion layer 54i. A second characteristic point is that transistors Tr1 to Tr6 are arranged in a direction in which carrier drift directions become the same.

First, the first characteristic point will be described.

In semiconductor device 9, source diffusion layer 54i extending from source diffusion layer 54a of transistor Tr1 to source diffusion layers 54b to 54h, is formed. The formation of source diffusion layer 54i attains a state in which source diffusion layers 54a to 54i are continuously formed, and diffusion layer 54i connects source diffusion layers 54a to 54h to each other. That is, transistors Tr1 to Tr6 share source diffusion layer 54 including source diffusion layers 54a to 54i.

The sharing of source diffusion layer 54 by transistors Tr1 to Tr6 allows the variation in contact resistance to be shared among the transistors. As a result, variation in characteristics of the transistors can be reduced.

In FIG. 16A, source diffusion layer 54 is connected with contact plugs 64. The number of contact plugs for supplying source diffusion layer 54 with electricity may be one. Adoption of a single contact plug to be connected can eliminate variation in characteristics of the transistors owing to variation in contact resistance.

Next, the second characteristic point will be described.

In semiconductor device 9, while the directions in which the source diffusion layers, the gate electrodes, the drain diffusion layers, the gate electrodes and the source diffusion layers of transistors Tr1 to Tr6 as the double gate transistor are formed in this sequence are the same, source diffusion layers 54a to 54h are connected to each other by forming source diffusion layer 54i. Accordingly, as indicated by hollow arrows in FIG. 16A, carrier drift directions of the transistors viewed on the semiconductor substrate become the same.

Here, the arrangement in which the carrier drift directions become the same allows the variation in symmetry of the source/drain diffusion layer to be reduced; a difference in threshold voltage is barely caused; the variation in characteristics of the transistors can be reduced.

As described above, in semiconductor device 9 of this exemplary embodiment, transistors Tr1 to Tr6 thus share the source diffusion layer, thereby allowing the variation in characteristics of the transistors to be reduced, even if there is a variation in the contact resistances of contact plugs connected to the source diffusion layer.

In semiconductor device 9 of this exemplary embodiment, transistors Tr1 to Tr6 are arranged in the direction in which the carrier drift directions become the same. Accordingly, variation in the threshold voltages of the transistors is barely caused, and the variation in characteristics of the transistors can be reduced.

In the current mirror circuit that includes at least three transistors, in terms of the structure, it is difficult to connect the source diffusion layers of the entire transistors and to cause the transistors to share the source diffusion layer. In order to further align the carrier drift direction of the transistors in this situation, the configuration in which the source diffusion layers of the transistors are routed and connected, as with this exemplary embodiment, is particularly useful.

As described above, according to the semiconductor device of this exemplary embodiment, even in a case where the number of transistors in which high ratio accuracies are required is at least three and the transistors are double gate transistors, the variation in characteristics of the transistors can be reduced.

In this exemplary embodiment, description has been made using the example of semiconductor device 9 in which transistors Tr1 to Tr6 are arranged in the matrix arrangement of two rows and three columns. However, the configuration is not limited thereto.

In consideration of the limitation on the arrangement region, transistors Tr1 to Tr6 may be arranged laterally adjacent to each other with respect to the direction in which the gate electrode extends. Transistors Tr1 to Tr6 may be arranged vertically adjacent to each other with respect to the direction in which the gate electrode extends.

In this exemplary embodiment, description has been made using the example in which contact plugs 64 connected to diffusion layer 54 between a first row (transistors Tr1 to Tr3) and a second row (transistors Tr4 to Tr6) are arranged in one column. However, the arrangement is not limited thereto.

Figure 17:
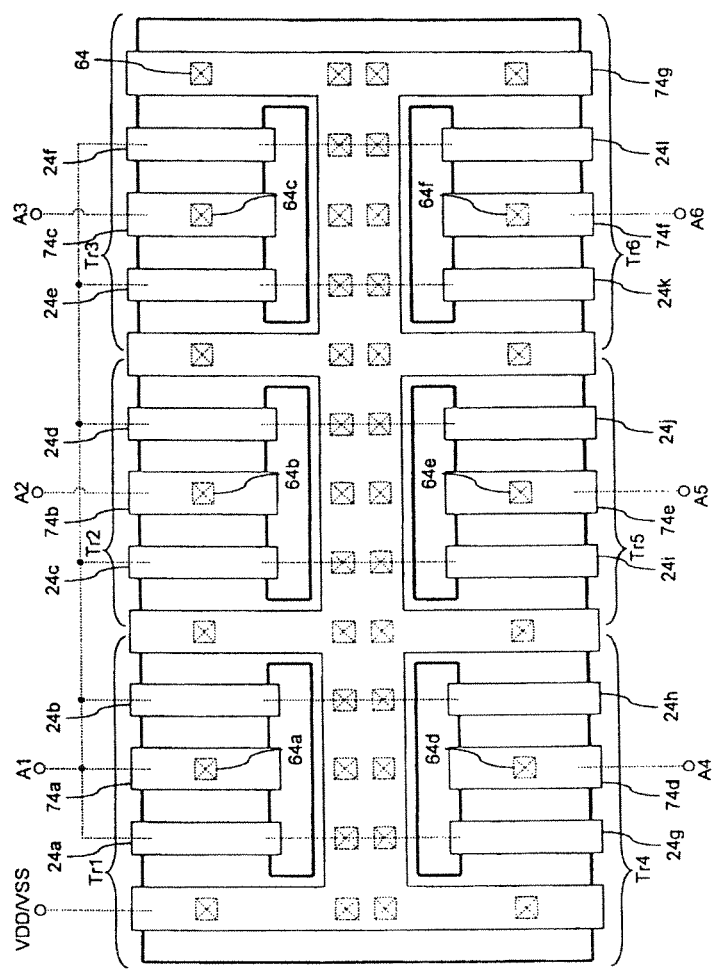
FIG. 17 is a plan view showing another configuration of a semiconductor device of the fourth exemplary embodiment.

For instance, as shown in FIG. 17, contact plugs 64 may be arranged in two rows between the first row (transistors Tr1 to Tr3) and the second row (transistors Tr4 to Tr6). This arrangement of the contact plugs allows the resistance value of contact resistance to be reduced at a position through which a large current flows. In FIG. 17, configurational elements corresponding to those in FIGS. 16A and 16B are assigned with the identical symbols. Description thereof is omitted.

In also a case where the aforementioned pair of transistors (transistor group) is applied to a pair of transistors (transistor group) in which high ratio accuracies are required, which is not only the pair of transistors (transistor group) of the current mirror circuit but also the pair of transistors (transistor group) that employs a current mirror circuit itself as a load, an effect that reduces the variation in characteristics of the transistors is exerted. For instance, this pair may be applied to a pair of transistors used for a differential input stage of an operational amplifier. The operational amplifier may be used, for instance, for comparing input data into a memory cell in DRAM (dynamic random access memory) with a reference voltage (Vref) and for amplifying the data.

In the first to fourth exemplary embodiments, the transistor has been described as a field effect transistor. The configuration is not limited thereto. Instead, the transistor may be a bipolar transistor.

In a current mirror circuit employing bipolar transistors, the bases of an input-side transistor and an output-side transistor are connected to each other. The emitters are connected with a power source. The corrector of the input-side transistor is connected to the base. In such a circuit configuration, the collector voltage of the input-side transistor is supplied to the base of the output-side transistor, and the collector current flows through the output-side transistor and is output as an output current.

In a case of realizing the semiconductor devices of the first to fourth exemplary embodiments employing bipolar transistors, a configuration is adopted in which base diffusion layers are shared among the transistors, and emitter diffusion layers of the transistors are connected to each other among the shared base diffusion layers.

It is apparent that the present invention is not limited to the above embodiments, but may be modified and changed without departing from the scope and spirit of the invention.

The invention claimed is:

1. A semiconductor device comprising:
first and second isolation regions formed separately from each other and arranged in a first direction;
a third isolation region including a window and formed such that the window accommodates the first and second isolation regions therein, the window including first and second side edges opposite to each other and third and fourth side edges opposite to each other, each of the first and second side edges extending in the first direction, and each of the third and fourth side edges extending in a second direction crossing the first direction;
an active region defined by the first, second isolation regions and the window of the third isolation region, the active region including a first portion between the first isolation region and the first side edge of the window of the third isolation region and a second portion between the second isolation region and the first side edge of the window of the third isolation region, the first portion including first and second channel regions that divide the first portion into first, second and third parts, the first channel region being between the first and second parts, the second channel region being between the second and third parts, the second portion including third and fourth channel regions that divide the second portion into fourth, fifth and sixth parts, the third channel region being between the fourth and fifth parts, and the fourth channel region being between the fifth and sixth parts;
a first gate electrode formed over the first channel region with an intervention of a first gate insulating film;
a second gate electrode formed over the second channel region with an intervention of a second gate insulating film;
a third gate electrode formed over the third channel region with an intervention of a third gate insulating film;
a fourth gate electrode formed over the fourth channel region with an intervention of a fourth gate insulating film;
a first drain region formed in the second part of the first portion of the active region;
a second drain region formed in the fifth part of the second portion of the active region; and
a common source region continuously formed in the first and third parts of the first portion of the active region, in the fourth and sixth parts of the second portion of the active region and in a portion of the active region along the first and second isolation regions.

2. The device as claimed in claim 1, wherein the first, second; third and fourth gate electrodes and the first drain region are coupled to one another so that a current mirror circuit, that produces at the first and second drain regions first and second drain currents proportional to each other, is constituted.

3. The device as claimed in claim 1,
wherein the device further comprises:
a fourth isolation region formed separately from each of the first and second isolation regions and arranged between the first isolation region and the second side edge of the window of the third isolation region so that the active region further includes a third portion between the fourth isolation region and the second side edge of the window of the third isolation region, the third portion including fifth and sixth channel regions that divide the third portion into seventh, eighth and ninth parts, the fifth channel region being between the seventh and eighth parts, and the sixth channel region being between the eighth and ninth parts;
a fifth gate electrode formed over the fifth channel region with an intervention of a fifth gate insulating film;
a sixth gate electrode formed over the sixth channel region with an intervention of a sixth gate insulating film; and
a third drain region formed in the eighth part of the third portion of the active region; and
wherein the common source region continuously extends to the seventh and ninth parts of the third portion of the active region.

4. The device as claimed in claim 3, wherein the first, second, third, fourth, fifth and sixth gate electrodes and the first drain region are coupled to one another so that a current mirror circuit, that produces at the first, second and third drain regions first, second and third drain currents proportional to one another, is constituted.

5. A semiconductor device comprising:
first and second isolation regions formed separately from each other and arranged in a first direction;
a third isolation including a window and formed such that the window accommodates the first and second isolation regions therein, the window including first and second side edges opposite to each other and third and fourth side edges opposite to each other, each of the first and second side edges extending in the first direction, and each of the third and fourth side edges extending in a second direction crossing the first direction;
an active region defined by the first, second isolation regions and the window of the third isolation region, the active region including a first portion between the first isolation region and the third side edge of the window of the third isolation region and a second portion between the second isolation region and the fourth side edge of the window of the third isolation region, the first portion including first and second channel regions that divide the first portion into first, second and third parts, the first channel region being between the first and second parts, the second channel region being between the second and third parts, the second portion including third and fourth channel regions that divide the second portion into fourth, fifth and sixth parts, the third channel region being between the fourth and fifth parts, and the fourth channel region being between the fifth and sixth parts;
a first gate electrode formed over the first channel region with an intervention of a first gate insulating film;
a second gate electrode formed over the second channel region with an intervention of a second gate insulating film;
a third gate electrode formed over the third channel region with an intervention of a third gate insulating film;
a fourth gate electrode formed over the fourth channel region with an intervention of a fourth gate insulating film;
a first drain region formed in the second part of the first portion of the active region;
a second drain region formed in the fifth part of the second portion of the active region; and
a common source region continuously formed in the first and third parts of the first portion of the active region, in the fourth and sixth parts of the second portion of the active region and in a portion of the active region along the first and second isolation regions.

6. The device as claimed in claim 5, wherein the first, second, third and fourth gate electrodes and the first drain region are coupled to one another so that a current mirror circuit, that produces at the first and second drain regions first and second drain currents proportional to each other, is constituted.

7. The device as claimed in claim 5
wherein the device further comprises:
a fourth isolation region formed separately from each of the first and second isolation regions and arranged between the first isolation region and the second side edge of the window of the third isolation region so that the active region further includes a third portion between the fourth isolation region and the third side edge of the window of the third isolation region, the third portion including fifth and sixth channel regions that divide the third portion into seventh, eighth and ninth parts, the fifth channel region being between the seventh and eighth parts, and the sixth channel region being between the eighth and ninth parts;
a fifth gate electrode formed over the fifth channel region with an intervention of a fifth gate insulating film;
a sixth gate electrode formed over the sixth channel region with an intervention of a sixth gate insulating film; and
a third drain region formed in the eighth part of the third portion of the active region; and
wherein the common source region continuously extends to the seventh and ninth parts of the third portion of the active region.

8. The device as claimed in claim 7, wherein the first, second, third, fourth, fifth and sixth gate electrodes and the first drain region are coupled to one another so that a current mirror circuit, that produces at the first, second and third drain regions first, second and third drain currents proportional to one another, is constituted.

9. A semiconductor device comprising:
first and second isolation regions formed separately from each other and arranged in a first direction;
a third isolation region including a window and formed such that the window accommodates the first and second isolation regions therein, the window including first and second side edges opposite to each other and third and fourth side edges opposite to each other, each of the first and second side edges extending in the first direction, and each of the third and fourth side edges extending in a second direction crossing the first direction;
an active region defined by the first, second isolation regions and the window of the third isolation region, the active region including a first portion between the first isolation region and the third side edge of the window of the third isolation region and a second portion between the first and second isolation regions, the first portion including first and second channel regions that divide the first portion into first, second and third parts, the first channel region being between the first and second parts, the second channel region being between the second and third parts, the second portion including third and fourth channel regions that divide the second portion into fourth, fifth and sixth parts, the third channel region being between the fourth and fifth parts, and the fourth channel region being between the fifth and sixth parts;

a first gate electrode formed over the first channel region with an intervention of a first gate insulating film;

a second gate electrode formed over the second channel region with an intervention of a second gate insulating film;

a third gate electrode formed over the third channel region with an intervention of a third gate insulating film;

a fourth gate electrode formed over the fourth channel region with an intervention of a fourth gate insulating film;

a first drain region formed in the second part of the first portion of the active region;

a second drain region formed in the fifth part of the second portion of the active region; and a common source region continuously formed in the first and third parts of the first portion of the active region, in the fourth and sixth parts of the second portion of the active region and in a portion of the active region along the first and second isolation regions.

10. The device as claimed in claim 1, wherein the first and third gate electrodes are continuous to each other to form a first common gate electrodes, and the second and fourth gate electrodes are continuous to each other to form a second common gate electrodes.

11. The device as claimed in claim 10, the first and second common gate electrodes and the first drain region are coupled to one another so that a current mirror circuit, that produces at the first and second regions first and second drain currents proportional to one another, is constituted.

* * * * *